United States Patent
Kudo et al.

(10) Patent No.: US 11,195,768 B2
(45) Date of Patent: Dec. 7, 2021

(54) THROUGH ELECTRODE SUBSTRATE, MANUFACTURING METHOD THEREOF AND MOUNTING SUBSTRATE

(71) Applicant: DAI NIPPON PRINTING CO., LTD., Tokyo-to (JP)

(72) Inventors: Hiroshi Kudo, Tokyo-to (JP); Takamasa Takano, Tokyo-to (JP)

(73) Assignee: DAI NIPPON PRINTING CO., LTD., Tokyo (JP)

( * ) Notice: Subject to any disclaimer, the term of this patent is extended or adjusted under 35 U.S.C. 154(b) by 231 days.

(21) Appl. No.: 16/306,883

(22) PCT Filed: Jun. 2, 2017

(86) PCT No.: PCT/JP2017/020702
§ 371 (c)(1),
(2) Date: Dec. 3, 2018

(87) PCT Pub. No.: WO2017/209296
PCT Pub. Date: Dec. 7, 2017

(65) Prior Publication Data
US 2021/0035874 A1     Feb. 4, 2021

(30) Foreign Application Priority Data
Jun. 3, 2016     (JP) .............................. JP2016-112104

(51) Int. Cl.
*H01L 23/15*     (2006.01)
*H01L 23/14*     (2006.01)
*H01L 23/532*    (2006.01)

(52) U.S. Cl.
CPC ............ *H01L 23/15* (2013.01); *H01L 23/145* (2013.01); *H01L 23/53238* (2013.01)

(58) Field of Classification Search
CPC ........... H01L 23/15; H01L 23/32; H05K 1/11; H05K 3/40
See application file for complete search history.

(56) References Cited

U.S. PATENT DOCUMENTS 6,313,043 B1 * 11/2001 Hattori .................... H01J 9/025
                                                  438/745
2010/0079050 A1 * 4/2010 Kamamori ............. H01L 33/62
                                                  313/113
(Continued)

FOREIGN PATENT DOCUMENTS

JP     H09-64231 A     3/1997
JP     2008-227433 A   9/2008
(Continued)

OTHER PUBLICATIONS

Jan. 9, 2018 Office Action issued in Japanese Patent Application No. 2017-564154.
(Continued)

*Primary Examiner* — Dung A. Le
(74) *Attorney, Agent, or Firm* — Oliff PLC

(57) ABSTRACT

A manufacturing method of a through electrode substrate includes: a step of preparing a substrate including a first surface and a second surface positioned oppositely to the first surface, and provided with a through hole; a step of providing a sealing layer blocking the through hole on the first surface of the substrate; an electrode forming step of forming a through electrode inside the through hole, the through electrode having a fist part extending along a sidewall of the through hole, and a second part connected to the first part and spreading along the sealing layer; and a step of removing the sealing layer.

23 Claims, 17 Drawing Sheets

(56) References Cited

U.S. PATENT DOCUMENTS

| | | | |
|---|---|---|---|
| 2010/0155940 A1* | 6/2010 | Kawashita | H01L 24/16 257/737 |
| 2011/0067913 A1* | 3/2011 | Kaneko | H01L 24/32 174/264 |
| 2011/0248405 A1 | 10/2011 | Li et al. | |
| 2015/0235955 A1 | 8/2015 | Kudo et al. | |
| 2016/0111380 A1 | 4/2016 | Sundaram et al. | |

FOREIGN PATENT DOCUMENTS

| | | |
|---|---|---|
| JP | 2009-135452 A | 6/2009 |
| JP | 2009-227433 A | 10/2009 |
| JP | 2015-103586 A | 6/2015 |
| JP | 2016-72433 A | 5/2016 |
| WO | 2014/069662 A1 | 5/2014 |
| WO | 2016/075863 A1 | 5/2016 |

OTHER PUBLICATIONS

Feb. 16, 2018 Office Action issued in Japanese Patent Application No. 2017-564154.

Dec. 12, 2019 Office Action issued in Taiwanese Patent Application No. 106118322.

Aug. 15, 2017 Search Report issued in International Patent Application No. PCT/JP2017/020702.

Dec. 4, 2018 International Preliminary Report on Patentability issued in International Patent Application No. PCT/JP2017/020702.

Apr. 2, 2021 Office Action issued in Japanese Patent Application No. 2018-078673.

Sep. 14, 2021 Office Action issued in Taiwanese Patent Application No. 109119705.

\* cited by examiner

THROUGH ELECTRODE SUBSTRATE, MANUFACTURING METHOD THEREOF AND MOUNTING SUBSTRATE

FIELD OF THE INVENTION

This embodiment of the disclosure relates to a through electrode substrate and a manufacturing method thereof. In addition, this embodiment of the disclosure relates to a mounting substrate including a through electrode substrate.

BACKGROUND ART

A member so-called through electrode substrate, which includes a substrate having a first surface and a second surface, a plurality of through holes provided in the substrate, and an electrode provided inside each through hole is widely used. For example, a through electrode substrate is used as an interposer interposed between two LSI chips, when a plurality of LSI chips are stacked in order to increase a packaging density of an LSI. In addition, a through electrode substrate is sometimes interposed between an element such as an LSI chip and a mounting substrate such as a motherboard. In the following description, an electrode provided inside a through hole is sometimes referred to as "through electrode".

As an example of a through electrode, so-called filled via and conformal via are known. In the case of a filled via, a through electrode contains an electroconductive material such as copper filled inside a through hole.

FIG. 37 shows an example of a through electrode substrate comprising a though electrode 22 formed as a filled via. In the case of a conformal via, as disclosed in Patent Document 1, for example, a through electrode includes a wall surface electroconductive layer spreading along a sidewall of a hole, a first surface electroconductive layer provided on a first surface of a substrate, and a second surface electroconductive layer provided on a second surface of the substrate. FIG. 38 shows an example of a through electrode substrate comprising a through electrode 22 formed as a conformal via.

Patent Document 1: JP2015-103586A

DISCLOSURE OF THE INVENTION

In order to efficiently use a surface area of a through electrode substrate, it is preferable that an element such as an LSI chip can be located on an area of a substrate, in which a through hole us provided. However, in the case of a conformal via, a through electrode is positioned on a wall surface of a through hole and a surface of a substrate, it is impossible to locate an element on an area of the substrate, in which a through hole is provided.

This embodiment of the disclosure has been made in view of the above circumstances. The object thereof is to provide a through electrode substrate which enables that an element can be located on an area of the substrate, in which a through hole is provided, and a manufacturing method thereof.

One embodiment of the disclosure is a manufacturing method of a through electrode substrate comprising: a step of preparing a substrate including a first surface and a second surface positioned oppositely to the first surface, and provided with a through hole; a step of providing a sealing layer blocking the through hole on the first surface of the substrate; an electrode forming step of providing a through electrode inside the through hole, the through electrode having a fist part extending along a sidewall of the through hole, and a second part connected to the first part and spreading along the sealing layer; and a step of providing the sealing layer.

The manufacturing method of a through electrode substrate according to the one embodiment of the disclosure may further comprise a step of providing a wiring layer on a side of the first surface of the substrate, the wiring layer having an electroconductive layer connected to the second part of the through electrode.

In the manufacturing method of a through electrode substrate according to the one embodiment of the disclosure, in a surface direction of the first surface of the substrate, a size of a part of the electroconductive layer of the wiring layer, which is connected to the second part of the through electrode, may be smaller than a size of the second part of the through electrode.

In the manufacturing method of a through electrode substrate according to the one embodiment of the disclosure, the electroconductive layer may include an electrode having a profile overlapped with the second part of the through electrode and surrounded by the second part, when seen along a normal direction of the first surface of the substrate.

In the manufacturing method of a through electrode substrate according to the one embodiment of the disclosure, the electroconductive layer may include a plurality of the electrode parts.

In the manufacturing method of a through electrode substrate according to the one embodiment of the disclosure, the electroconductive layer may include a conducive wire part intersecting a profile of the second part of the through electrode, when seen along a normal direction of the first surface of the substrate.

In the manufacturing method of a through electrode substrate according to the one embodiment of the disclosure, the electroconductive layer may include a plurality of the conducive wire parts.

In the manufacturing method of a through electrode substrate according to the one embodiment of the disclosure, the substrate may contain glass.

One embodiment of the disclosure is a through electrode substrate comprising: a substrate including a first surface and a second surface positioned oppositely to the first surface, and provided with a through hole; and a through electrode provided inside the through hole of the substrate; wherein: the through electrode has a first part spreading along a sidewall of the through hole, and a second part connected to the first part and spreading in a surface direction of the first surface to come into contact with the sidewall of the through hole on a side of the first surface of the substrate; and a hollow part exists inside the through hole between surfaces of the opposed first parts.

In the through electrode substrate according to the embodiment of the disclosure, the second part of the through electrode may be positioned coplanarly with the first surface of the substrate.

In the through electrode substrate according to the embodiment of the disclosure, a size of the through hole in the surface direction of the first surface of the substrate may increase from the first surface toward the second surface.

In the through electrode substrate according to the embodiment of the disclosure, the substrate may contain glass.

In the through electrode substrate according to the embodiment of the disclosure, a plurality of the through holes and a plurality of the through electrodes may be formed in the substrate, and the second parts of the through electrodes may be uniformly distributed in the first surface of the substrate.

The through electrode substrate according to the embodiment of the disclosure may further comprise a wiring layer provided on the side of the first surface of the substrate, and having an electroconductive layer connected to the second part of the through electrode.

In the through electrode substrate according to the embodiment of the disclosure, in the surface direction of the first surface of the substrate, a size of a part of the electroconductive layer of the wiring layer, which is connected to the second part of the through electrode, may be smaller than a size of the second part of the through electrode.

In the through electrode substrate according to the embodiment of the disclosure, the electroconductive layer may include an electrode part having a profile overlapped with the second part of the through electrode and surrounded by the second part, when seen along a normal direction of the first surface of the substrate.

In the through electrode substrate according to the embodiment of the disclosure, the electroconductive layer may include a plurality of the electrode parts.

In the through electrode substrate according to the embodiment of the disclosure, the electroconductive layer may include a conducive wire part intersecting a profile of the second part of the through electrode, when seen along a normal direction of the first surface of the substrate.

In the through electrode substrate according to the embodiment of the disclosure, the electroconductive layer includes a plurality of the conducive wire parts.

In the through electrode substrate according to the embodiment of the disclosure, the wiring layer may further have an insulation layer containing an organic material, and a stress relaxation layer containing an inorganic material.

In the through electrode substrate according to the embodiment of the disclosure, the wiring layer may have a first wiring layer including the electroconductive layer positioned on the first surface of the substrate and the insulation layer, and a second wiring layer including the electroconductive layer positioned on the first wiring layer and the insulation layer, and the stress relaxation layer may be positioned at least between the first surface of the substrate and the insulation layer of the first wiring layer, or between the insulation layer of the first wiring layer and the insulation layer of the second wiring layer.

One embodiment of the disclosure is a mounting substrate comprising: a through electrode substrate; and an element loaded on the through electrode substrate; wherein: the through electrode substrate comprises a substrate provided with a through hole passing therethrough from a first surface to a second surface positioned oppositely to the first surface, and a through electrode provided inside the through hole of the substrate; the through electrode has a first part spreading along a sidewall of the through hole, and a second part connected to the first part and spreading in a surface direction of the first surface to come into contact with the sidewall of the through hole on a side of the first surface of the substrate; a hollow part exists inside the through hole between surfaces of the opposed first parts; the through electrode further comprises an electrode part positioned on the second part of the through electrode; and the element has a terminal connected to the electrode part.

Due to the through electrode substrate according to one embodiment of the disclosure, an element can be located on an area of the substrate, in which a through hole is provided.

DETAILED DESCRIPTION OF THE INVENTION

Figure 1:
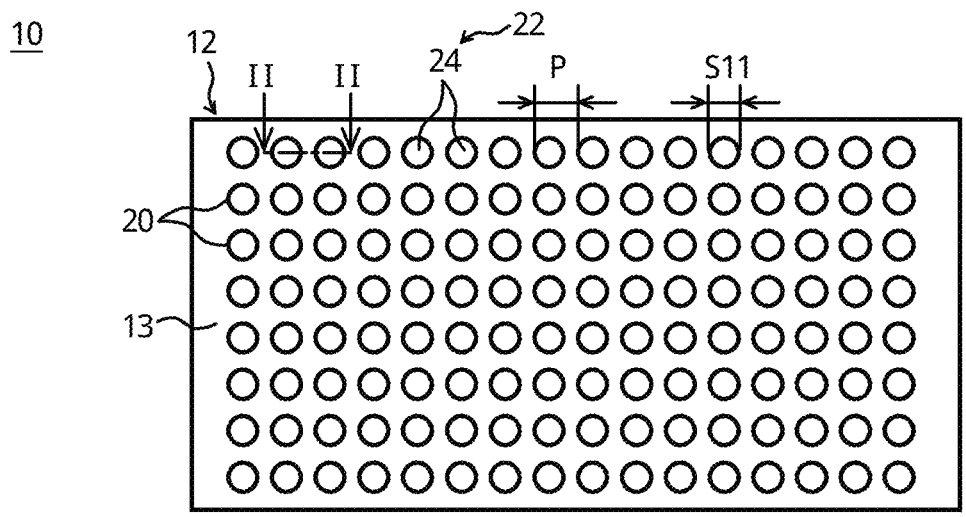
FIG. 1 is a plan view showing a through electrode substrate according to an embodiment of a disclosure.

Herebelow, a structure of a through electrode substrate according to an embodiment of the disclosure and a manufacturing method thereof are described in more detail with reference to the drawings. The below embodiments are mere examples of this embodiments of the disclosure, and the disclosure should not be construed to be limited to these embodiments. In this specification, the terms "substrate", "base member", "sheet" and "film" are not differentiated from one another, based only on the difference of terms. For example, the "substrate" or the "base member" is a concept including a member that can be referred to as sheet or film. Further, terms specifying shapes, geometric conditions and their degrees, e.g., terms such as "parallel", "perpendicular", etc. and values of a length and a value, etc., are not limited to their strict definitions, but should be construed to include a range capable of exerting a similar function. In addition, in the drawings referred in embodiments, the same parts or parts having a similar function have the same reference number or similar reference number, and repeated description may be omitted. In addition, a scale size may be different from the actual one, for the convenience of easiness in illustration and understanding, and a part of a structure may be omitted from the drawings.

This embodiment of the disclosure is described herebelow with reference to FIGS. 1 to 15.

Through Electrode Substrate

Figure 2:
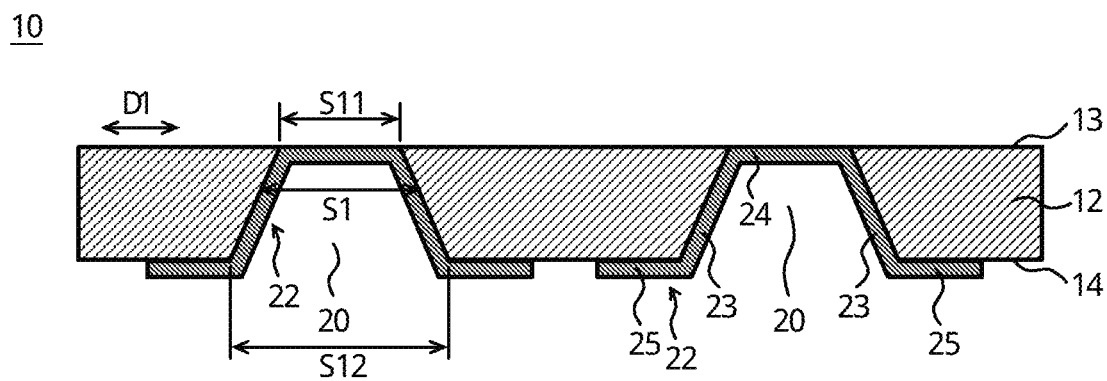
FIG. 2 is a sectional view of the through electrode substrate of FIG. 1 seen from a II-II direction.

A through electrode substrate 10 according to this embodiment is firstly described with reference to FIGS. 1 and 2. FIG. 1 is a plan view showing the through electrode substrate 10. FIG. 2 is a sectional view of the through electrode substrate 10 of FIG. 1, which is cut along one-dot chain lines, seen from a II-II direction.

The through electrode substrate 10 comprises a substrate 12, a plurality of through holes 20 provided in the substrate 12, and a through electrode 22 provided inside each through hole 20. Herebelow, the respective constituent elements of the through electrode substrate 10 are described.

(Substrate)

The substrate 12 includes a first surface 13 and a second surface 14 positioned oppositely to the first surface 13. The substrate 12 is made of a material having a certain insulation property. For example, the substrate 12 may be a glass substrate, a quartz substrate, a sapphire substrate, a resin substrate, a silicon substrate, a silicon carbide substrate, an alumina ($Al_2O_3$) substrate, a aluminum nitride (AlN) substrate, a zirconium oxide ($ZrO_2$) substrate and so on, or a substrate made by stacking these substrates. The substrate 12 may include a substrate made of a material having an electroconductive property, such as an aluminum substrate, a stainless substrate and so on.

A thickness of the substrate 12 is not particularly limited, but the use of the substrate 12 having a thickness of not less than 100 μm and not more than 800 μm is preferred. More preferably, the substrate 12 has a thickness of not less than 200 μm and not more than 600 μm. When the substrate 12 has a thickness of not less than 100 μm, warpage of the substrate 12 can be prevented from increasing. Thus, it can be prevented that handling of the substrate 12 during a manufacturing step becomes difficult, and that the substrate 12 is warped because of an internal stress of a membrane formed on the substrate 12. In addition, when the substrate 12 has a thickness of not more than 800 μm, it can be prevented that a period of time required for a step of forming the through holes 20 in the substrate 12 is elongated to increase a manufacturing cost of the through electrode substrate 10.

(Through Hole)

Each of the through holes 20 is provided in the substrate 12 so as to extend from the first surface 13 of the substrate 12 to reach the second surface 14 thereof. A size S1 of the though hole 20 in a surface direction D1 of the first surface 13 is within a range of, for example, not less than 20 μm and not more than 150 μm, in each position in a thickness direction of the substrate 12. In addition, an interval P between the adjacent two through holes 20 in the surface direction D1, i.e., an arrangement pitch of the through holes 20 is, for example, within a range between not less than 40 μm and not more than 300 μm. The dimension S1 of the through hole in the surface direction D1 of the first surface 13 is a maximum value of an opening width of the through hole 20, when the through hole 20 is cut along a given plane parallel to the first surface 13. In addition, the surface direction D1 is a direction parallel to the first surface 13. In FIGS. 1 and 2, a reference numeral S11 depicts a size of the through hole 20 on the first surface 13 of the substrate 12. In addition, in FIG. 2, the reference numeral S11 depicts a size of the through hole 20 on the second surface 14 of the substrate 12.

(Through Electrode)

The through electrode 22 is a member having an electroconductive property, which is provided inside the through hole 20. As shown in FIG. 2, the through electrode 22 has at least a first part 23 and a second part 24. The first part 23 is a part that spreads from the side of the first surface 13 to the side of the second surface 14 along a sidewall 21 of the through hole 20. The second part 24 is a part that is connected to the first part 23 at an end portion of the first pat 23 on the side of the first surface 13, and spreads in the surface direction D1 of the first surface 13 to come into contact with the sidewall 21 of the through hole 20 on the side of the first surface 13.

As shown in FIG. 2, the through electrode 22 may further have a third part 25. The third part 25 is a part that is connected to the first part 23 on an end portion of the first part 23 on the side of the second surface 14, and is provided on the second surface 14.

Figure 3:
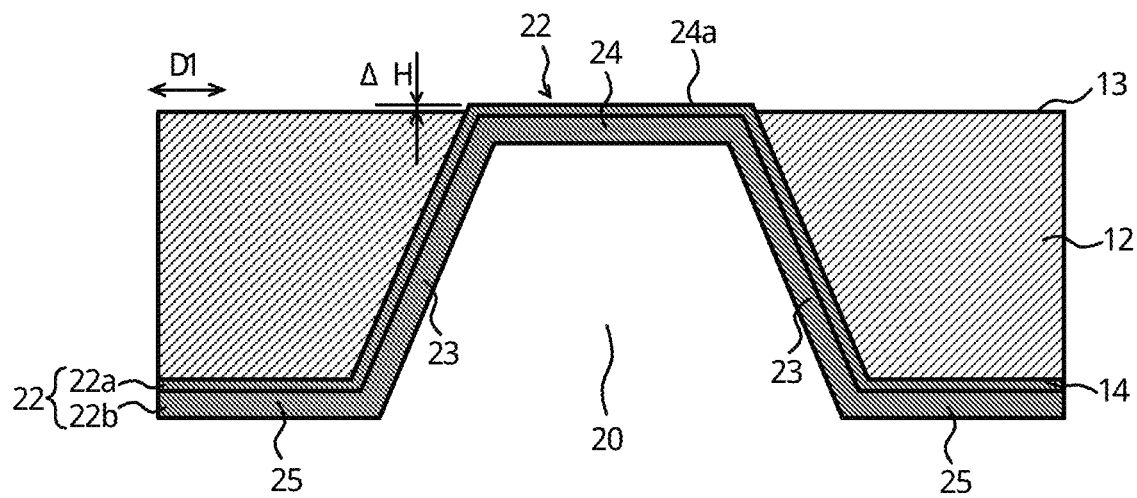
FIG. 3 is a sectional view showing in enlargement a through electrode of the through electrode substrate of FIG. 2.

FIG. 3 is a sectional view showing in enlargement the through electrode 22 of the through electrode substrate 10 of FIG. 2. Preferably, the second part 24 of the through electrode 22 is positioned coplanarly with the first surface 13 of the substrate 12. The term "coplanar" means that, in a normal direction of the first surface 13 of the substrate 12, a difference ΔH between the position of the first surface 13 and the position of an outer surface 24a of the second part 24 is not more than 1 μm. The difference ΔH can be measured by means of a reflection-type confocal laser microscope or a finger-type step gauge. Although FIG. 3 shows an example in which the outer surface 24a of the second part 24 projects outward from the first surface 13, the present invention is not limited thereto. Although not shown, the outer surface 24a of the second part 24 may be recessed inward from the first surface 13, as long as the difference ΔH is not more than 1 μm.

As long as the through electrode 22 has an electroconductive property, a method of forming the through electrode 22 is not particularly limited. For example, the through electrode 22 may be formed by a physical film deposition method such as a vapor deposition method or a sputtering method, or may be formed by a chemical film deposition method or a plating method. In addition, the through electrode 22 may be composed of a single layer having an electroconductive property, or may include a plurality of layers having an electroconductive property. Herein, as shown in FIG. 3, an example in which the through electrode 22 includes a first layer 22a and a second layer 22b both having an electroconductive property is described.

The first layer 22a is a so-called seed layer which is a layer having an electroconductive property, and serves as a base on which metal ions in a plating liquid deposit to grow the second layer 22b, during an electrolytic plating step of forming the second layer 22b by a plating process. Preferably, an electroconductive material having a high adhesion property to the material of the substrate 12 is used as a material of the first layer 22a. For example, as the material of the first layer 22a, titanium, molybdenum, tungsten, tantalum, nickel, chrome, aluminum, a compound of them, an alloy of them, or lamination of them may be used. In addition, as the material of the first layer 22a, a material that prevents the second layer 22b from diffusing inside the substrate 12 may be used. For example, when the second layer 22b contains copper, the first layer 22a may also contain copper. When the first layer 22a contains copper, a layer of a metal material, which has a high adhesion property to the substrate 12, such as titanium or titanium nitride, may be provided between the substrate 12 and the first layer 22a, in order to increase an adhesion property between the substrate 12 and the first layer 22a. When the first layer 22a has a sufficient thickness and an electroconductive property, the first layer 22a may constitute the through electrode 22, without providing the second layer 22b.

When the second layer 22b is provided on the first layer 22a, a thickness of the first layer 22a is, for example, not more than 0.2 μm. When the second layer 22b is not provided, the thickness of the first layer 22a is, for example, not less than 1 μm and not more than 10 μm.

The second layer 22b is a layer having an electroconductive property, which is provided on the first layer 22a in order to increase an electroconductive property of the through electrode 22. As a material of the second layer 22b, an electroconductive material having a high adhesion property to the first layer 22a and a high electroconductive property is preferably used. For example, a metal such as copper, gold, silver, platinum, rhodium, tin, aluminum, nickel and chrome, alloy of them, or lamination of them may be used as the material of the second layer 22b. A thickness of the second layer 22b is within a range between not less than 1 μm and not more than 10 μm, for example.

The thickness of the second layer 22b is determined in accordance with the electroconductive property required for the through electrode 22.

For example, when the through electrode 22 is a member for conduction of a power supply line or a ground line, the second layer 22b having a sufficient thickness is used. On the other hand, when the through electrode 22 is a member for conduction of a weak electric signal, the second layer 22b having a small thickness may be used. Alternatively, only the second layer 22a may be provided on the through hole 20 to constitute the through electrode 22, without providing the second layer 22b.

The through electrode 22 is configured to form a hollow part inside the through hole 20. The hollow part is an area inside the though hole 20 where any sold bodies such as the first layer 22a and the second layer 22b do not exist. In other words, as shown in FIG. 3, the hollow part is the area inside the through hole 20, which is between surfaces of the first parts 23 opposed inside the through hole 20. The surface is a surface of the first part 23, which is positioned oppositely to a surface on the side of the sidewall of the through hole 20. A size of the hollow part in the surface direction D1 of the first surface 13 is, for example, not less than 20% and not more than 90% of the size S1 when it is measured on the same position in the thickness direction of the substrate 12.

Since the through electrode 22 is formed such that the hollow part 26 is formed inside the through hole 20, the time required for forming the through electrode 22 can be reduced, as compared with a case in which the inside of the through hole 20 is completely filled with the through electrode 22.

Although not shown, a material having an insulation property, such as resin, may be provided in the hollow part. Owing to this, it is possible to prevent that a process liquid such as a developing liquid or a washing liquid enters the hollow part during a manufacturing step of the through electrode substrate 10.

As shown in FIG. 2, preferably, the size S1 of the through hole 20 in the surface direction D1 of the first surface 13 of the substrate 12 increases from the first surface 13 toward the second surface 14. In other words, the through hole 20 has a tapered shape that narrows toward the first surface 13. Thus, when a below-described sealing layer 17 is peeled from the second part 24 of the through electrode 22, the second part 24 is prevented from being pulled to move toward the side of the first surface 13. It is not necessary that the through hole 20 has the tapered shape as a whole. As long as the through electrode 22 is prevented from being pulled to move by the sealing layer 17, various shapes can be employed as the shape of the through hole 20.

The size S11 of the through hole 20 on the first surface 13 of the substrate 12 is, for example, not less than 10 μm and not more than 100 μm. In addition, the size S12 of the through hole 20 on the second surface 14 of the substrate 12 is, for example, not less than 20 μm and not more than 200 μm.

As shown in FIG. 1, preferably, the second parts 24 of the through electrodes 22 are uniformly distributed on the first surface 13 of the substrate 12. For example, when the substrate 12 is virtually divided equally into sections the number of which is N in the surface direction D1, the number of through holes 20 formed in the N sections is within a range of an average value ±20%. Herein, N is a suitable integer of e.g., 16.

(Wiring Layer)

Figure 4:
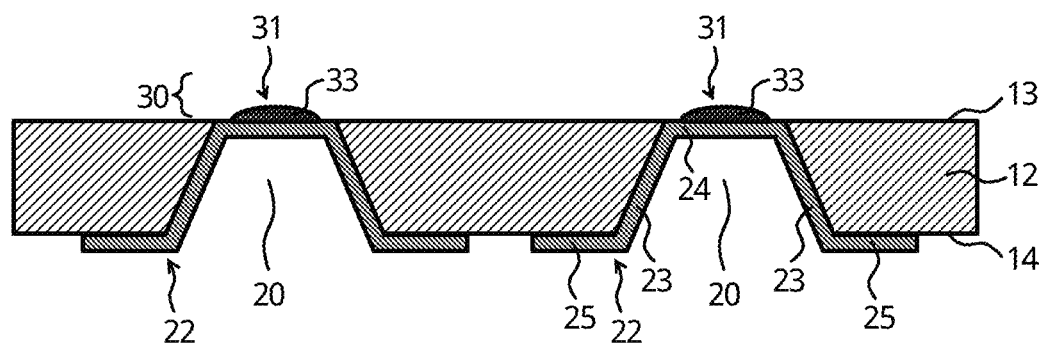
FIG. 4 is a sectional view showing an example in which the through electrode substrate of FIG. 1 further has a wiring layer.

As shown in FIG. 4, the through electrode substrate 10 may further comprise a wiring layer 30 provided on the side of the first surface 13 of the substrate 12. The wiring layer 30 has at least an electroconductive layer 31 connected to the second part 24 of the through electrode 22. In the example shown in FIG. 4, the electroconductive layer 31 includes an electrode part 33 provided on the second part 24 of the through electrode 22. For example, the electrode part 33 is a bump that is connected to a terminal 52 of an element 51 described below. A material having an electroconductive property, such as a metal, is used as a material of the electroconductive layer 31.

Figure 5A:
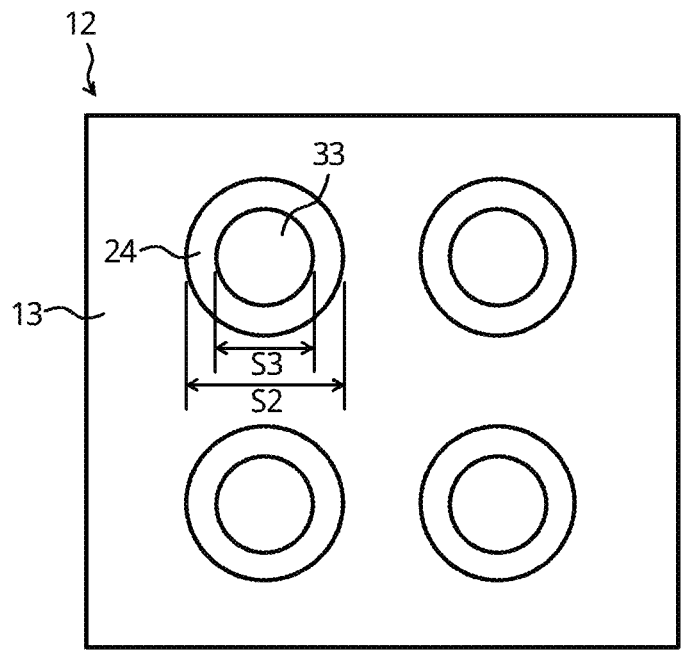
FIG. 5A is a plan view of the through electrode substrate in the example shown in FIG. 4.

FIG. 5A is a plan view of the through electrode substrate 10 of the example shown in FIG. 4. As shown in FIG. 5A, both the second part 24 of the through electrode 22 and the electrode part 33 have a circular shape in a plan view. In addition, the electrode part 33 is overlapped with the second part 24 of the through electrode 22, when seen along the normal direction of the substrate 12. In addition, the electrode part 33 has a profile that is surrounded by the second part 24 of the through electrode 22, when seen along the normal direction of the substrate 12. For example, in the surface direction D1 of the first surface 13, a size S3 of the electrode part 33 is smaller than a size S2 of the second part 24.

Figure 5B:
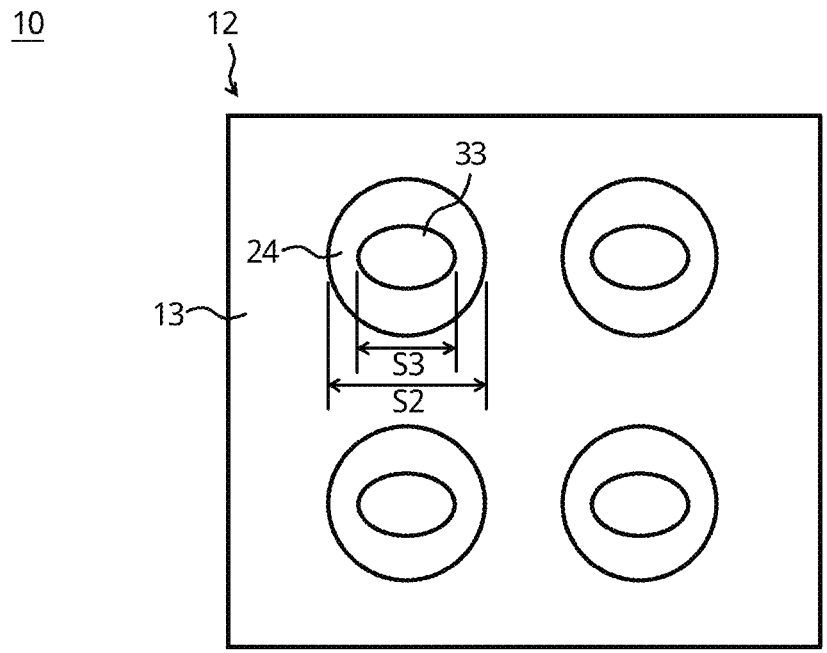
FIG. 5B is a plan view showing another example of the through electrode substrate.
Figure 5C:
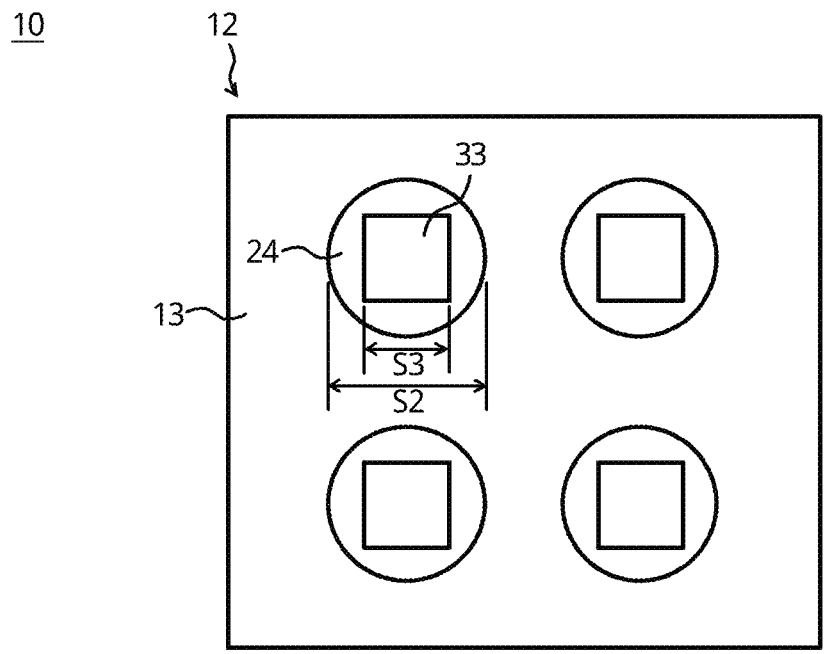
FIG. 5C is a plan view showing another example of the through electrode substrate.

FIGS. 5B and 5C are plan views respectively showing other examples of the through electrode substrate 10. The shape of the electrode part 33 in a plan view is optional. For example, as shown in FIG. 5B, the electrode part 33 may have an elliptical shape in a plan view. In this case, the size of S3 of the elliptical electrode part 33 in a major-axis direction may be smaller than the size S2 of the second part 24.

Alternatively, as shown in FIG. 5C, the electrode part 33 may have a quadrangular shape in a plan view. In this case, the size S3 of one side of the quadrangular electrode part 33 may be smaller than the size S2 of the second part 24.

The shape of the second part 24 of the through electrode 22 in a plan view is also optional.

Manufacturing Method of Through Electrode Substrate

Herebelow, an example of a manufacturing method of through electrode substrate 10 is described with reference to FIGS. 6 to 15.

(First Resist Layer Forming Step)

Figure 6:
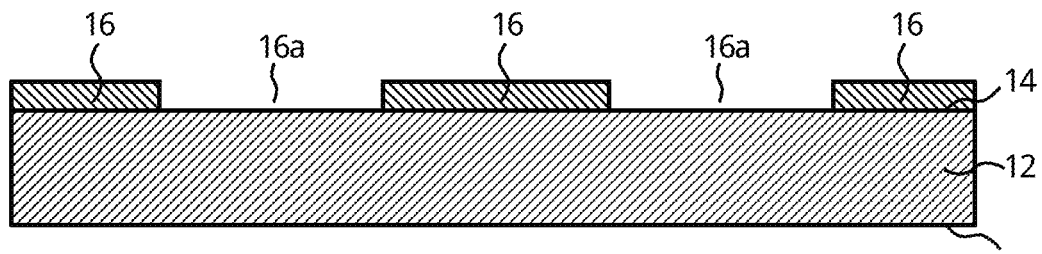
FIG. 6 is a view showing a step in which a resist layer is provided on a substrate.

Firstly, the substrate 12 is prepared. Then, as shown in FIG. 6, a first resist layer 16 is provided on the second surface 14 of the substrate 12. The first resist layer 16 is provided such that it covers an area of the second surface 14 of the substrate 12, in which the through hole 20 is not formed. An opening 16a of the first resist layer 16 is positioned on an area of the second surface 14 of the substrate 12, in which the through hole 20 is formed.

(Through Hole Forming Step)

Figure 7:
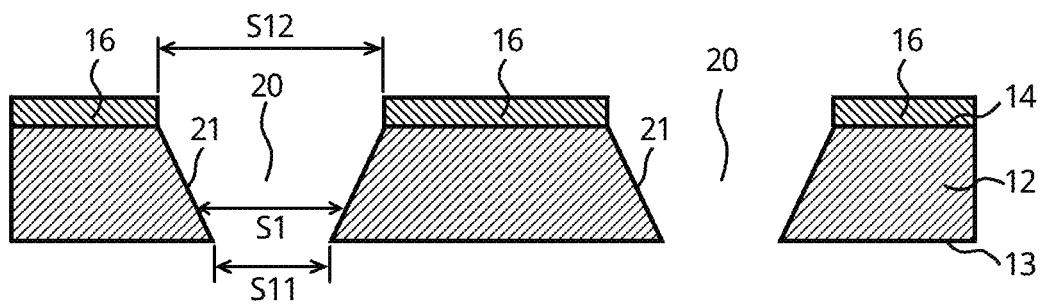
FIG. 7 is a view showing a step in which a through hole is formed in the substrate.

Thereafter, the substrate 12 is processed in the opening 16a of the first resist layer 16 from the side of the second surface 14, so that a plurality of the through holes 20 are formed in the substrate 12, as shown in FIG. 7. As a method of processing the substrate 12, a dry etching method, such as a reactive ion etching method or a deep reactive ion etching method, a wet etching method and the like may be used. Following thereto, the first resist layer 16 is removed. In this manner, the substrate 12 provided with the through holes 20 can be prepared.

Preferably, as shown in FIG. 7, the substrate 12 is processed such that each through hole 20 has a tapered shape that narrows from the side of the the second surface 14 toward the side of the first surface 13. For example, the through hole 20 has the size S12 of about 50 μm on the side of the second surface 14, and has the size S11 of about 30 μm on the side of the first surface 13.

When the substrate 12 contains glass, hydrogen fluoride (HF), a mixture liquid of ammonium fluoride ($NH_4F$) and hydrogen fluoride, that is, so-called buffered fluoride may be used as an etching liquid for wet etching the substrate 12. Alternatively, when the substrate 12 contains silicon, potassium hydroxide (KH), tetramethylammonia hydroxide (TMAH), ethylene diamine pyrocatechol (EDP), hydration hydrazine ($N_2H_4.H_2O$), etc. may be used as an etching liquid for wet etching the substrate 12.

As the dry etching method, a dry etching RIE (Reactive Ion Etching) method using plasma, a DRIE (Deep Reactive Ion Etching RIE) method using a Bosch process, a sand blasting method, and so on may be used.

The through holes 20 may be formed in the substrate 12 by irradiating the substrate 12 with a laser. In this case, the first resist layer 16 may not be provided. As a laser for the laser machining, an excimer laser, an Nd:YAG laser, a femtosecond laser and so on may be used. When an Nd:YAG laser is used, a fundamental wave having a wavelength of 1064 nm, a second radiofrequency having a wavelength of 532 nm, and a third radiofrequency having a wavelength of 355 nm and so on may be used.

In addition, laser radiation and wet etching may suitably be combined. To be specific, an altered layer is formed by laser radiation on an area of the substrate 12, in which the through holes 20 should be formed. Then, the substrate 12 is immersed in hydrogen fluoride to etch the altered layer. Thus, the through holes 20 can be formed in the substrate 12.

In FIGS. 6 and 7, although an example in which the substrate 12 is processed from the side of the second surface 14 so as to form the through holes 20 in the substrate 12, the present invention is not limited thereto. For example, the substrate 12 may be processed from the side of the first surface 13 so as to form the through holes 20 in the substrate 12. In addition, the substrate 12 may be processed from both the sides of the first surface 13 and the second surface 14 so as to form the through holes 20 in the substrate 12.

(Sealing Layer Forming Step)

Figure 8:
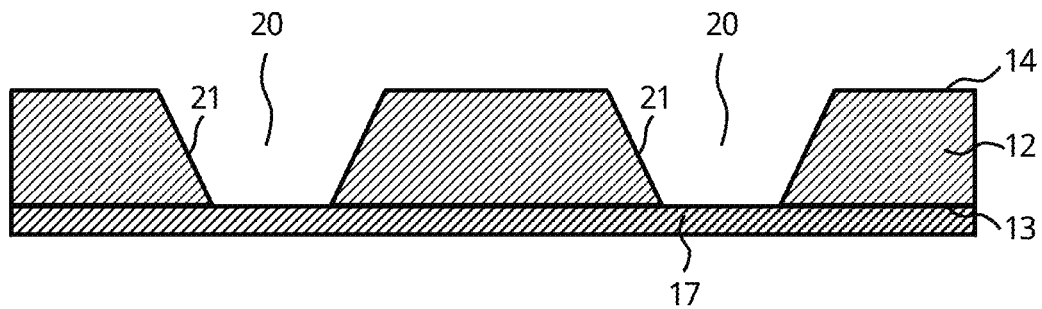
FIG. 8 is a view showing a step in which a sealing layer is provided on a first surface side of the substrate.

Then, as shown in FIG. 8, a sealing layer 17 blocking the through holes 20 is provided on the first surface 13 of the substrate 12. The sealing layer 17 is a layer serving as a base when the second part 24 of the aforementioned through electrode 22 is deposited inside the through hole 20. The sealing layer 17 includes, for example, a base member layer containing a resin such as polyethylene terephthalate, and an adhesive layer laminated on the base member layer to be adhered to the first surface 13 of the substrate 12. The sealing layer 17 is a dicing tape, for example.

Preferably, the adhesive layer of the sealing layer 17 contains a photo-curing resin that is cured when irradiated with light such as ultraviolet light. In this case, after the second part 24 of the through electrode 22 has been formed on the sealing layer 17, the sealing layer 17 is irradiated with light such as ultraviolet light so that the adhesive layer of the sealing layer 17 is cured. Thus, the sealing layer 17 can be easily peeled from the first surface 13 of the substrate 12.

(Electrode Forming Step)

Figure 9:
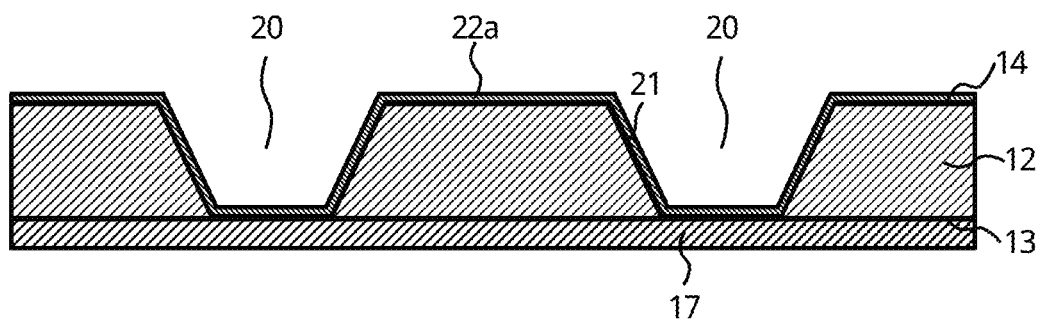
FIG. 9 is a view showing a step in which a first layer is provided on the substrate from a side of a second surface.

Then, an electrode forming step in which the through electrode 22 is formed inside the through hole 20 is carried out. In the electrode forming step, as shown in FIG. 9, the first layer 22a is firstly formed from the side of the second surface 14 of the substrate 12 on the second surface 14 of the substrate 12, the sidewall 21 of the through hole 20 and the sealing layer 17, at a part where the through hole 20 is blocked. As a method of forming the first layer 22a, a physical film deposition method such as a vapor deposition method or a sputtering method, or a chemical film deposition method may be used, for example.

Figure 10:
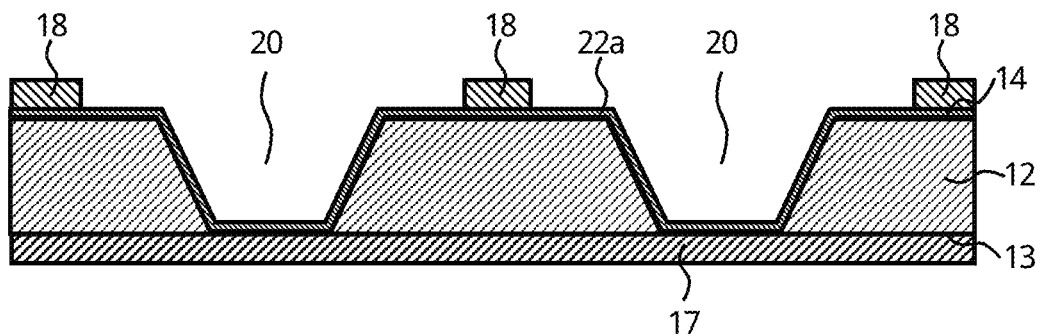
FIG. 10 is a view showing a step in which a resist layer is provided on the first layer.

Following thereto, as shown in FIG. 10, a second resist layer 18 is partially formed on the first layer 22a above the second surface 14 of the substrate 12. To be specific, the second resist layer 18 is formed such that an area of the second surface 14, on which the third part 25 of the through electrode 22 is not provided, is covered with the second resist layer 18.

Figure 11:
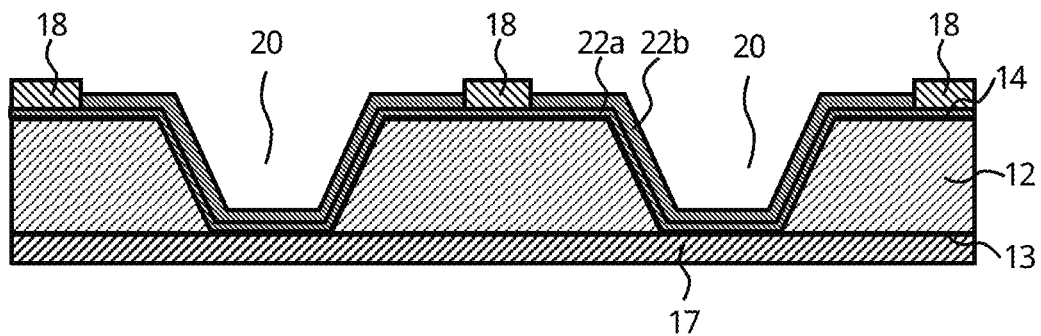
FIG. 11 is a view showing a step in which a second layer is provided on the first layer.
Figure 12:
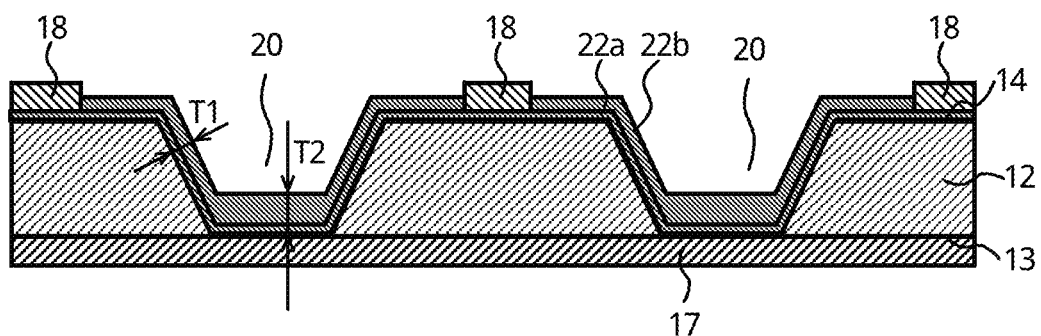
FIG. 12 is a view showing a step in which a thickness of the second layer on the sealing layer is increased.

Following thereto, as shown in FIG. 11, the second layer 22b is formed on the first layer 22a by electrolytic plating. To be specific, a plating liquid is supplied from the side of the first surface 14 of the substrate 12, and current is applied to the first layer 22a. Thus, it is possible to form the first layer 22a and the second layer 22b which spread over the sidewall 21, over the sealing layer 17 and over the second surface 14, along the sealing layer 17. A part of the first layer 22a and the second layer 22b, which extends along the sidewall 21, becomes the first part 23 of the through electrode 22. A part of the first layer 22a and the second layer 22b, which spreads along the sealing layer 17, becomes the second part 24 of the through electrode 22. A part of the first layer 22a and the second layer 22b, which spreads along the second surface 14, becomes the third part 25 of the through electrode 22. Preferably, the electrolytic plating is continued until a thickness T2 of the first layer 22a and the second layer 22b formed on the sealing layer 17 becomes larger than a thickness T1 of the first layer 22a and the second layer 22b formed on the sidewall 21 of the through hole 20, as shown in FIG. 12. For example, the thickness T2 is larger than the thickness T1 at least by 1 μm.

Figure 13:
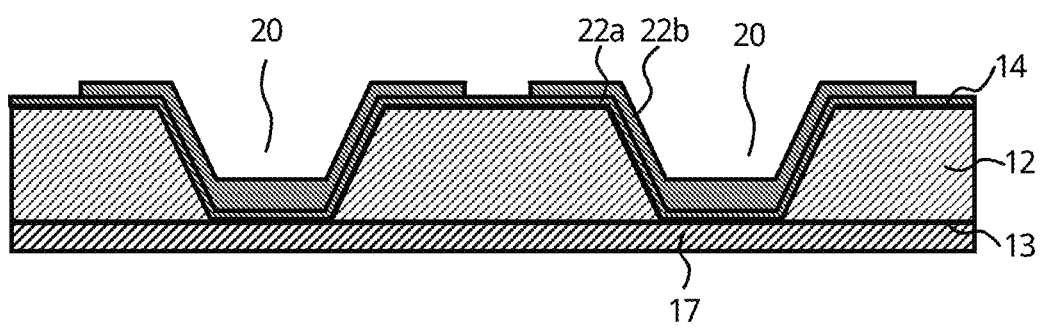
FIG. 13 is a view showing a step in which the resist layer is removed.
Figure 14:
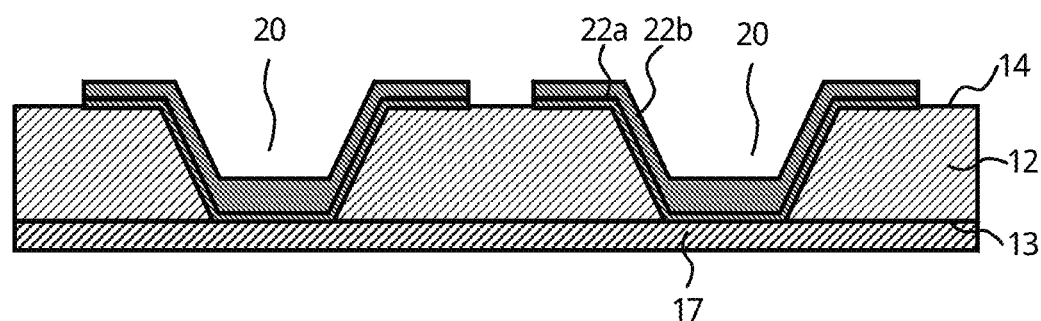
FIG. 14 is a view showing a step in which a part of the first layer is removed.
Figure 15:
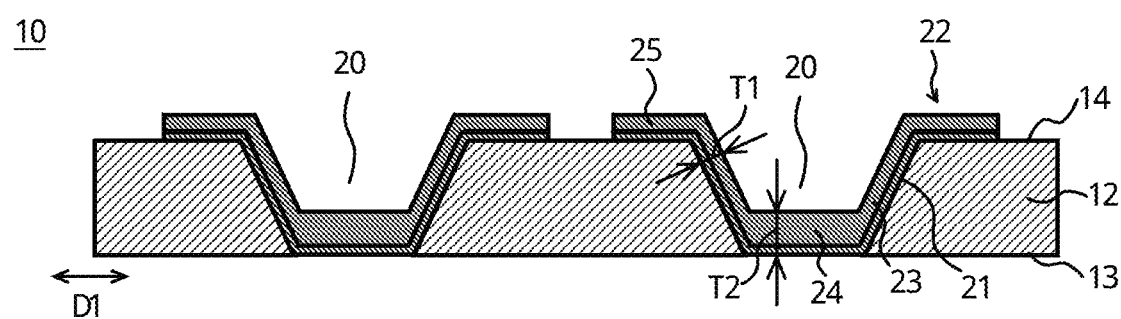
FIG. 15 is a view showing a step in which the sealing layer is removed.

Following thereto, as shown in FIG. 13, the second resist layer 18 is removed. Then, as shown in FIG. 14, the first layer 22a which has been covered with the second resist layer 18 is removed. Thereafter, as shown in FIG. 15, the sealing layer 17 is removed. For example, the sealing layer 17 is firstly irradiated with ultraviolet light so that an adhesive force of the adhesive layer of the sealing layer 17 is decreased. Then, the sealing layer 17 is peeled from the substrate 12. In this manner, the through electrode 22 including the first layer 22a and the second layer 22b can be formed. The through electrode 22 has the first part 23 that extends along the sidewall 21 of he through hole 20, the second part 24 that is connected to the first part 23 and spreads in the surface direction D1 of the first surface 13 to come into contact with the sidewall 21 of the through hole 20 on the side of the first surface 13 of the substrate 12, and the third part 25 that is connected to the first part 23 and provided on the second surface 14.

In the above description, an example in which the first part 23, the second part 24 and the third part 25 of the through electrode 22 are simultaneously formed is shown, but the present invention is not limited thereto. For example, although not shown, the second part 24, the first part 23 and the third part 25 may be sequentially formed. Alternatively, after the second part 24 has been formed, the first part 23 and the third part 25 may be simultaneously formed. In this case, a step of removing the sealing layer 17 may be carried out between the step of forming the second part 24 and the step of forming the first part 23. Alternatively, after the second part 24 and the first part 23 have simultaneously been formed, the third part 25 may be formed.

Advantages of the aforementioned manufacturing method of the through electrode substrate 10 according to this embodiment are described herebelow.

According to this embodiment, the through electrode 22 is formed inside the through hole 20, with the through hole 20 being blocked by the sealing layer 17. Thus, even when a so-called conformal via, in which there exists a hollow part inside the through hole 20, is employed, the second part 24 of the through electrode 22, which is positioned coplanarly with the first surface 13 of the substrate 12, can be provided on an area overlapped with the through hole 20. Thus, the through electrode 22 and the electroconductive layer 31 of the wiring layer 30 can be connected in the area overlapped with the through hole 20. Therefore, since it is not necessary to ensure an area on the first surface 13 of the substrate 12 to be connected to the electroconductive layer 31 of the wiring layer 30, an interval P between the adjacent two through holes 20 can be made smaller. As a result, a distribution density of the through holes 20 of the through electrode substrate 10 can be increased. In addition, the employment of the conformal via reduces a time required for the step of forming the through electrode 22, as compared with the case of the filled via.

Manufacturing Method of Through Electrode Substrate in Comparative Embodiment

As a method of forming the through electrode 22 having the first part 23 and the second part 24, a below method according to a comparative embodiment is conceivable in addition to the aforementioned method according to this embodiment. Herebelow, the manufacturing method of the through electrode substrate 10 according to the comparative embodiment is described with reference to FIGS. 16 to 18.

Figure 16:
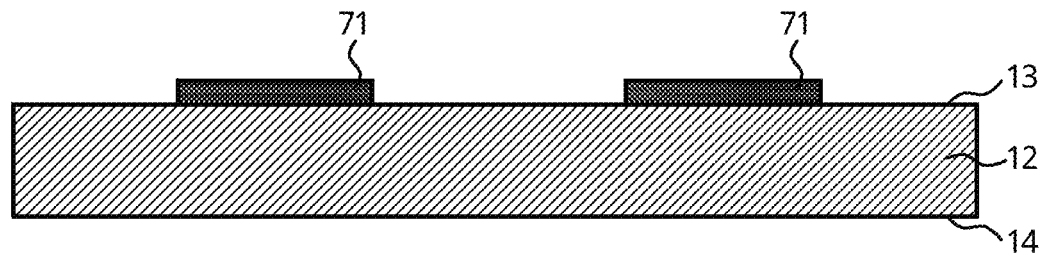
FIG. 16 is a view describing a manufacturing method of a through electrode substrate according to a comparative embodiment.
Figure 17:
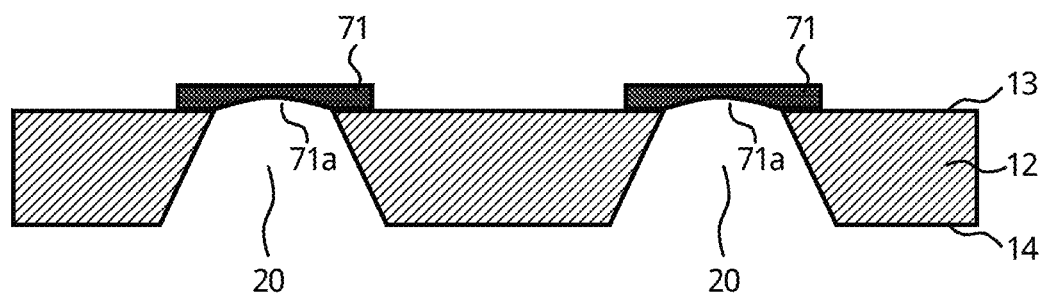
FIG. 17 is a view describing the manufacturing method of a through electrode substrate according to the comparative embodiment.
Figure 18:
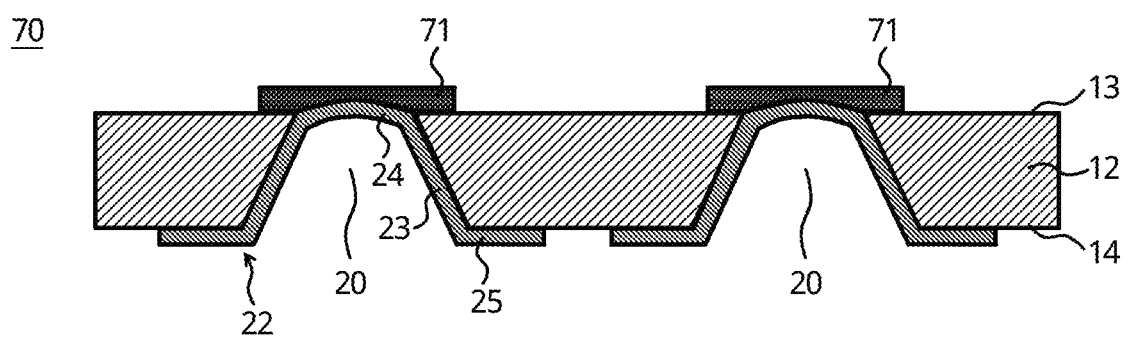
FIG. 18 is a view describing the manufacturing method of a through electrode substrate according to the comparative embodiment.

As shown in FIG. 16, an electroconductive layer 71 is firstly provided on a first surface 13 of a substrate 12. To be specific, the electroconductive layer 71 is provided so as to cover a through hole 20 that is succeedingly formed in the substrate 12. Then, as shown in FIG. 17, the through hole 20 is formed in the substrate 12 from the side of a second surface 14. For example, the through hole 20 is formed in the substrate 12 by dry etching, wet etching, laser irradiation, etc. Thereafter, as shown in FIG. 18, a through electrode 22 to be connected to the electroconductive layer 71 is formed inside the through hole 20.

In the comparative embodiment, as described above, after the electroconductive layer 71 has been provided on the side of the first surface 13 of the substrate 12, the through hole 20 is formed from the side of the second surface 14 of the substrate 12. In this case, when the process of the substrate 12 reaches the electroconductive layer 71 across the first surface 13 of the substrate 12, as shown in FIG. 17, a recess 71a is formed in the electroconductive layer 71. Thus, in the comparative embodiment, the electroconductive layer 71 needs to have a sufficiently large thickness in order to prevent that the recess 71a passes through the electroconductive layer 71. As a result, the thickness of the through electrode substrate 10 as a whole increases. In addition, when the thickness of the electroconductive layer 71 is large, the through electrode substrate 10 is likely to be warped because of a residual stress inside the electroconductive layer 71. In addition, in a case where the through hole 20 is formed by dry etching or wet etching, when an etching gas and/or an etching liquid remains in the recess 71a of the electroconductive layer 71, the electroconductive layer 71 is likely to become corroded. As a result, connection reliability between the electroconductive layer 71 and the through electrode 22 is impaired.

In addition, in the step of forming the through hole 20 in the substrate 12 by processing the substrate 12 from the side of the second surface 14, there is a possibility that a position and/or a size of the through hole 20 deviates from a design because of a manufacturing tolerance. In order that the through hole 20 is covered with the electroconductive layer 71 even when the position and/or the size of the through hole 20 deviates from the design, it is necessary that the size of the electroconductive layer 71 in the surface direction of the first surface 13 of the substrate 12 is made larger than the size of the through hole 20 and the second part 24 of the through electrode 22 by at least the manufacturing tolerance. Thus, the electroconductive layer 71 spreads up to a part that is not overlapped with the through hole 20. In this case, an interval between the adjacent two through holes 20 is set in consideration of a part that spreads up to the part of the electroconductive layer 71, which is not overlapped with the through hole 20. Therefore, in the comparative embodiment, it is not easy to increase a distribution density of the through holes 20 of the through electrode substrate 10.

On the other hand, in this embodiment, after the second part 24 of the through electrode 22 has been formed, the electroconductive layer 31 of the wiring layer 30 is formed on the second part 24. In addition, since the second part 24 is formed on the surface of the sealing layer 17, the outer surface 24a of the second part 24 has a flatness equivalent to the surface of the sealing layer 17. Thus, even when the thickness of the electroconductive layer 31 is small, the connection reliability between the electroconductive layer 31 and the second part 24 of the through electrode 22 can be ensured. Thus, the thickness of the through electrode substrate 10 as a whole can be made smaller. In addition, it can be prevented that the through electrode substrate 10 is warped because of a residual stress inside the electroconductive layer 31.

In addition, according to this embodiment, since the electroconductive layer 31 of the wiring layer 30 is formed on the outer surface 24a of the second part 24, the size S3 of the electroconductive layer 31 in the surface direction of the first surface 13 of the substrate 12 can be made smaller than the size of the second part 24. As a result, the interval P between the adjacent two through holes 20 can be made smaller. Owing thereto, the distribution density of the through holes 20 of the through electrode substrate 10 can be increased.

Mounting Substrate

Herebelow, an example of the use of the through electrode substrate 10 according to this embodiment is described. Herein, an example in which a mounting substrate 50 is formed by loading an element 51 on the through electrode substrate 10 is described.

Figure 19:
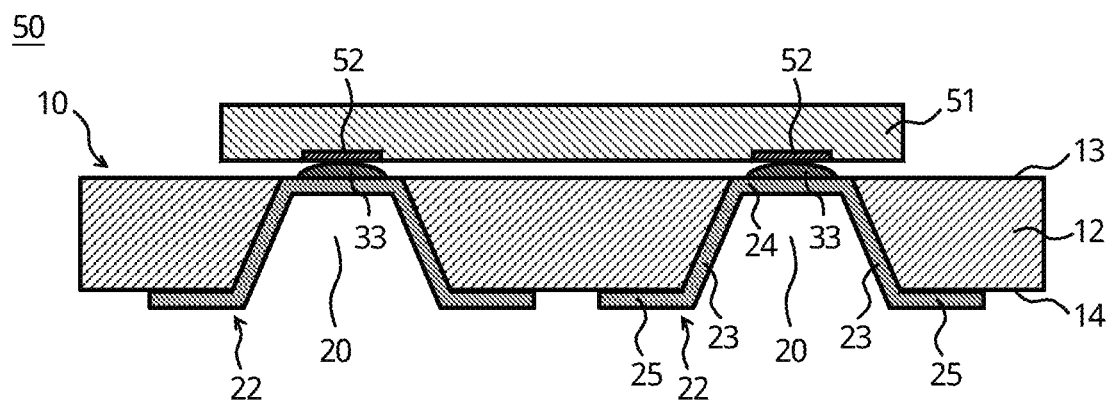
FIG. 19 is a sectional view showing an example of a mounting substrate including the through electrode substrate according to this embodiment of the disclosure.
Figure 20:
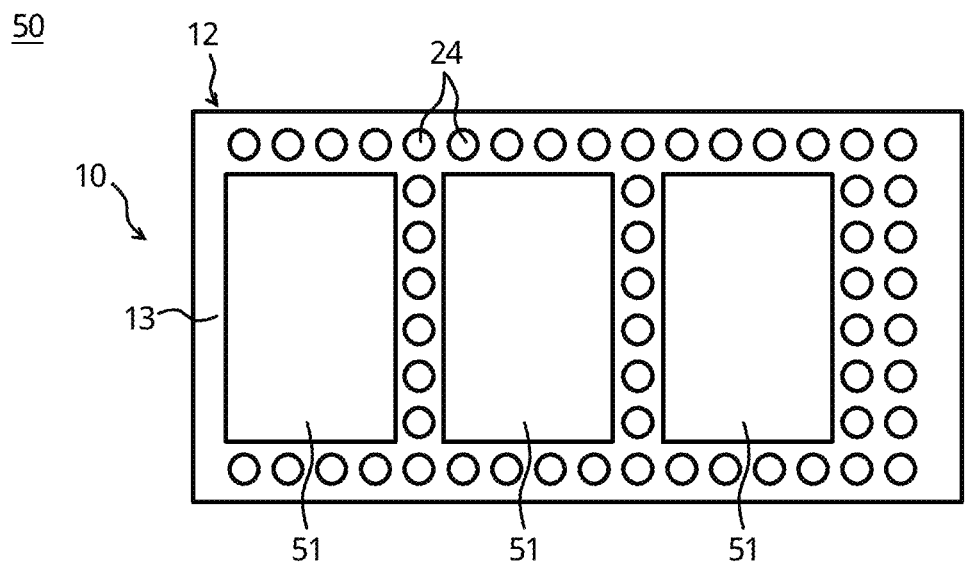
FIG. 20 is a plan view showing the mounting substrate in the example shown in FIG. 19.

FIG. 19 is a sectional view showing the mounting substrate 50. FIG. 20 is a plan view of the mounting substrate 50 shown in FIG. 19. The mounting substrate 50 includes the through electrode substrate 10, and an element 51 loaded on the through electrode substrate 10 on the side of the first surface 13 of the substrate 12. The element 51 is an LSI chip such as a logic IC or a memory IC. The element 51 may be a MEMS (Micro Electro Mechanical Systems) chip. A MEMS chip is an electronic device in which a mechanical component, a sensor, an actuator, an electronic circuit and so on are integrated on one substrate. As shown in FIG. 19, the element 51 has a terminal 52 connected to the electrode part 33 of the wiring layer 30 of the through electrode substrate 10.

Figure 21:
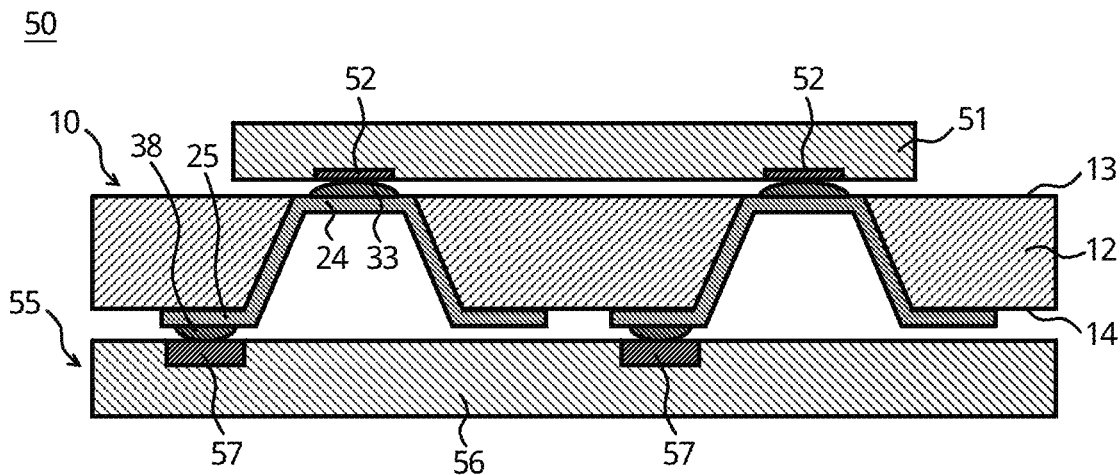
FIG. 21 is a sectional view showing another example of the mounting substrate.

As shown in FIG. 21, the mounting substrate 50 may further comprise a circuit board 55 connected to the through electrode substrate 10 on the side of the second surface 14 of the substrate 12. In this case, the through electrode substrate 10 of the mounting substrate 50 further has an electrode part 38 provided on the third part 25 of the through electrode 22. In addition, the circuit board 55 has a base member 56, and an electrode part 57 provided on the base member 56 to be connected to the electrode part 38 of the through electrode substrate 10.

The base member 56 of the circuit board 55 contains an organic material such as polyimide, epoxy, acryl or the like. In this case, when the base member 56 is subjected to a certain heat treatment, there is a possibility that an internal stress is generated in the base member 56 because of thermal expansion. Here, according to this embodiment, since the substrate 12 of the through electrode substrate 10 contains a highly rigid material such as glass or silicon, it can be prevented that the internal stress of the base member 56 gives an impact on the element 51 loaded on the side of the first surface 13 of the through electrode substrate 10 and the wiring layer 30. Thus, the connection reliability between the through electrode substrate 10 and the element 51 can be ensured.

The aforementioned embodiment can be variously modified. Herebelow, modification examples are described with reference to the drawings according to need. In the below description and the drawings for the description, the same part as that of the above embodiment is shown by the same reference number, and detailed description thereof is omitted. In addition, when the effect obtained in the above embodiment is apparently obtained also in the modification examples, description thereof may be omitted.

First Modification Example

Figure 22:
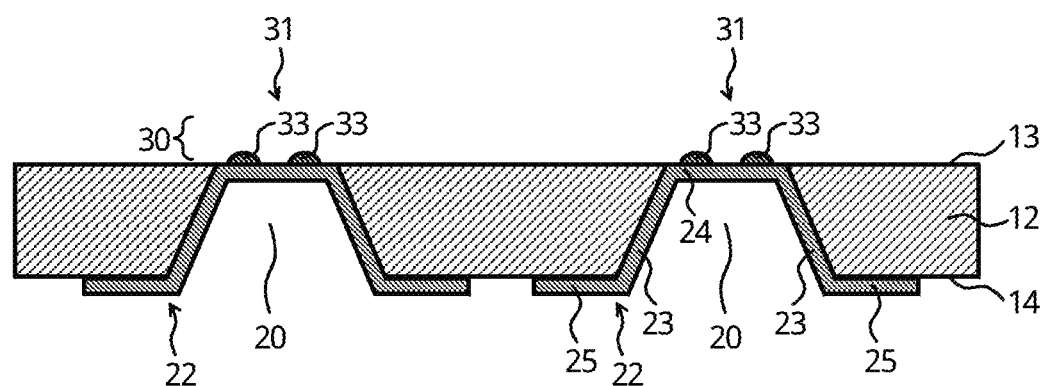
FIG. 22 is a sectional view showing the through electrode substrate according to a first modification example.
Figure 23:
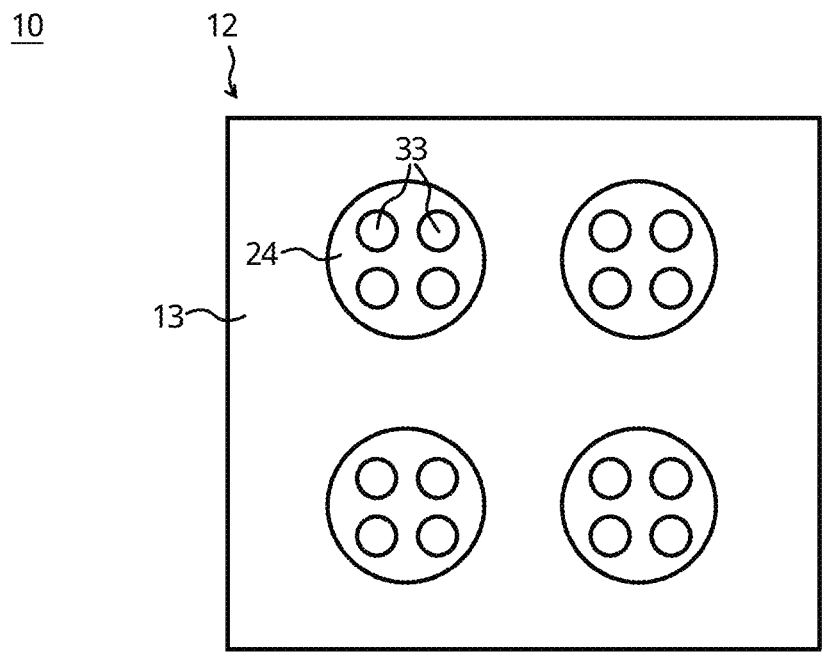
FIG. 23 is a plan view showing the through electrode substrate according to the first modification example.

FIG. 22 is a sectional view of the through electrode substrate according to a first modification example. FIG. 23 is a plan view of the through electrode substrate 10 according to the first modification example, when seen from the side of the first surface 13 of the substrate 12. As shown in FIGS. 22 and 23, the electroconductive layer 31 of the wiring layer 30 may include a plurality of the electrode parts 33 provided on the second part 24 of the through electrode 22. Since the electroconductive layer 31 of the wring layer 30 is formed after the second part 24 of the through electrode 22 of the through electrode substrate 10 has been formed, the electrode part 33 of the electroconductive layer 31 on the second part 24 can be divided into plural ones.

Second Modification Example

Figure 24:
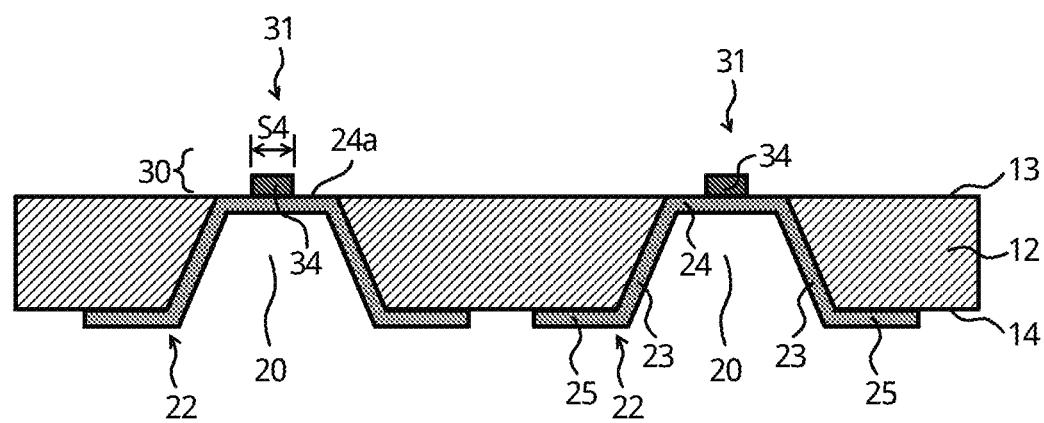
FIG. 24 is a sectional view showing the through electrode substrate according to a second modification example.
Figure 25:
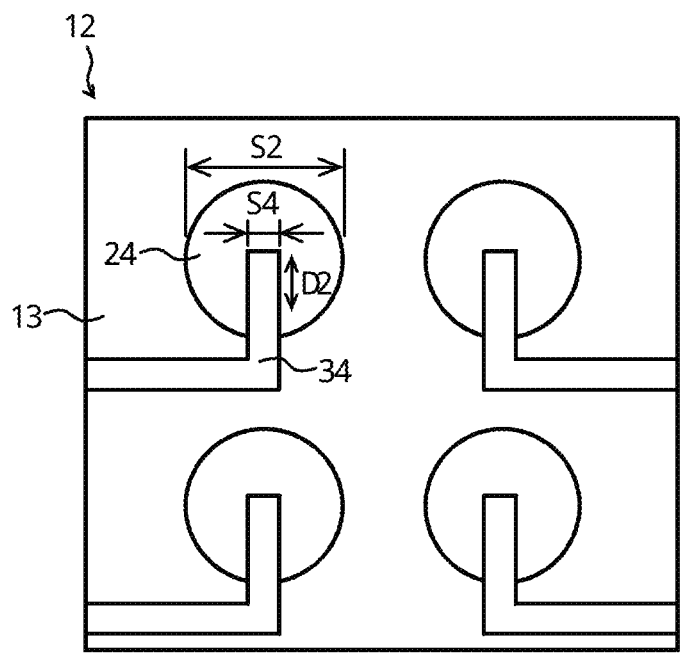
FIG. 25 is a plan view showing the through electrode substrate according to the second modification example.

FIG. 24 is a sectional view showing the through electrode substrate 10 according to a second modification example. FIG. 25 is a plan view of the through electrode substrate 10 according to the second modification example, when seen from the side of the first surface 13 of the substrate 12. As shown in FIGS. 24 and 25, the electroconductive layer 31 of the wiring layer 30 includes a conductive wire part 34 that intersects the profile of the second part 24 of the through electrode 22, when seen along the normal direction of the first surface 13 of the substrate 12. As shown in FIG. 25, in the surface direction D1 of the first surface 13, a size S4 of the conductive wire part 34 positioned on the second part 24 is smaller than the size S2 of the second part 24. The size S4 of the conductive wire part 34 is measured in a direction perpendicular to a second direction D2 along which the conductive wire part 34 positioned on the second part 24 extends.

As described above, the second part 24 of the through electrode 22 of the through electrode substrate 10 is positioned coplanarly with the first surface 13 of the substrate 12. In other words, there is little step between the outer surface 24a of the second part 24 and the first surface 13 of the substrate 12. Thus, even when the conductive wire part 34 extends across the second part 24 and the first surface 13 as in this modification example, it is possible to prevent that a stress is concentrated on a part of the conductive wire part 23 caused by the step, whereby the disconnection of the conductive wire part 34 can be prevented. Thus, reliability of the conductive wire part 34 can be ensured. In addition, since the thickness of the conductive wire part 34 can be made smaller, the thickness of the through electrode substrate 10 as a whole can be made smaller.

Third Modification Example

Figure 26:
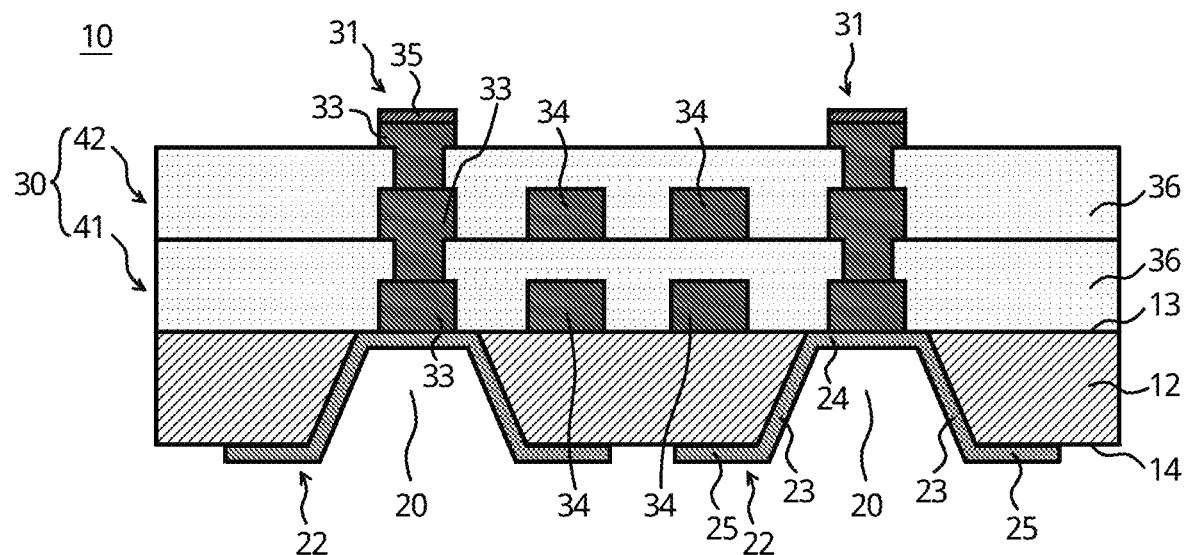
FIG. 26 is a sectional view showing the through electrode substrate according to a third modification example.

FIG. 26 is a sectional view of the through electrode substrate according to a third modification example. As shown in FIG. 26, the wiring layer 30 provided on the side of the first surface 13 of the substrate 12 may further have an insulation layer 36 in addition to the electroconductive layer 31. The insulation layer 36 contains an organic material having an insulation property. For example, it contains polyimide. In this case, the electroconductive layer 31 includes, for example, the electrode part 33 serving as a through electrode passing through the insulation layer 36, and the conductive wire part 34 covered with the insulation layer 36.

As shown in FIG. 26, the wiring layer 30 may have a plurality of layers each including the electroconductive layer 31 and the insulation layer 36. For example, the wiring layer 30 has a first wiring layer 41 including the electroconductive layer 31 provided on the first surface 13 of the substrate 12 and the insulation layer 36, and a second wiring layer 42 including the electroconductive layer 31 provided on the first wiring layer 41 and the insulation layer 36.

As shown in FIG. 26, a layer of the wiring layer 30, which is positioned nearest to the surface, herein, the second wiring layer 42 may further include a coating layer 35 provided on the electrode part 33. The coating layer 35 contains an electroconductive material having corrosion resistance. For example, it contains gold. In addition, the coating layer 35 may include a plurality of layers. For example, the coating layer 35 may include a gold layer positioned nearest to the surface, and a nickel layer located between the gold layer and the electrode part 33.

Figure 27:
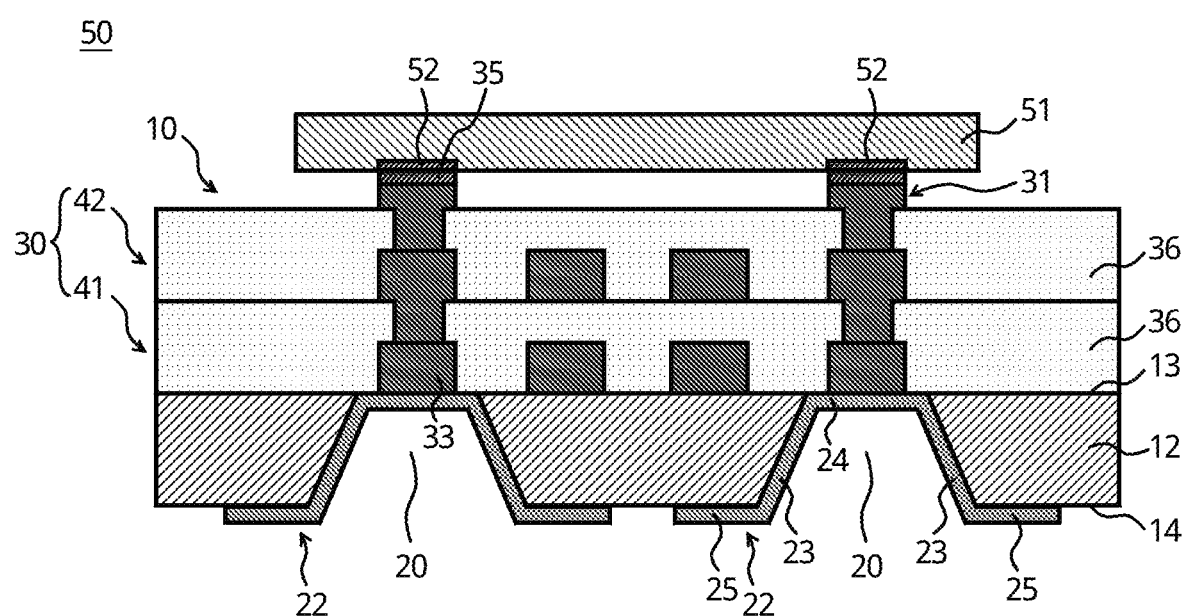
FIG. 27 is a sectional view showing a mounting substrate including the through electrode substrate according to the third modification example.

As shown in FIG. 27, the mounting substrate 50 may be formed by loading the element 51 on the wiring layer 30 shown in FIG. 26. The aforementioned coating layer 35 functions as a pad connected to the terminal 52 of the element 51. Although not shown, the coating layer 35 may not be provided. Also in this case, the mounting substrate 50 can be formed by connecting the terminal 52 of the element 51 to the electrode part 33 of the second wiring layer 42 of the wiring layer 30.

Herebelow, an example of the manufacturing method of the wiring layer 30 according to this modification example is described with reference to FIGS. 28 to 32.

Figure 28:
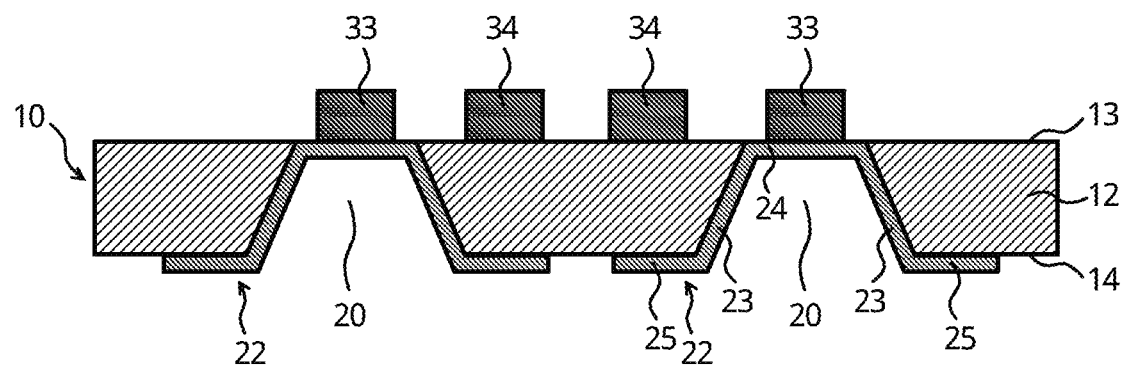
FIG. 28 is a view describing a manufacturing method of the through electrode substrate according to the third modification example.

Firstly, the through electrode substrate 10 according to the above embodiment is prepared. Then, as shown in FIG. 28, the electrode part 33 is formed on the second part 24 of the through electrode 22 of the through electrode substrate 10. In addition, the conductive wire part 34 is formed on the first surface 13 of the substrate 12 of the through electrode substrate 10.

As a method of forming the electrode part 33 and the conductive wire part 34, for example, the same method as the method of forming the through electrode 22 of the through electrode substrate 10 can be employed. For example, formation of the first layer functioning as a seed layer, formation of the resist layer, formation of the second layer by an electrolytic plating process, removal of the resist layer, and the removal of the first layer are carried out in this order. In this case, the the electrode part 33 and the conductive wire part 34 respectively have the first layer having an electroconductive property and functioning as a seed layer, and the second layer having an electroconductive property and formed on the first layer by an electrolytic plating process. A layer of metal material such as titanium or titanium nitride, which has high adhesiveness to the through electrode 22 or the substrate 12, may be provided between the first layer functioning as a seed layer and the through electrode 22 or the substrate 12.

In the through electrode substrate 10 according to the above embodiment, there is little step between the outer surface 24a of the second part 24 and the first surface 13 of the substrate 12. Thus, even when the thickness of the electroconductive layer 31 provided on the outer surface 24a of the second part 24 and the first surface 13 of the substrate 12, such as the aforementioned first layer of the electrode part 33 and the conductive wire part 34, is small, disconnection of the electroconductive layer 31 caused by the step can be prevented.

Figure 29:
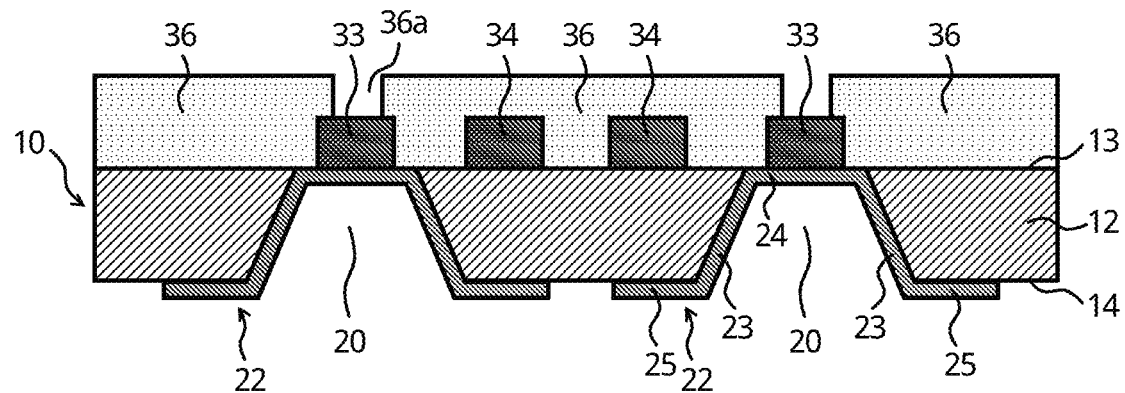
FIG. 29 is a view describing the manufacturing method of the through electrode substrate according to the third modification example.

Then, a layer of an organic material having a photosensitive property and an insulation property is provided on the first surface 13 of the substrate 12 so as to cover the electrode part 33 and the conductive wire part 34. Thereafter, the layer of an organic material is exposed to be developed, such that a part of the layer of an organic material, which is on the electrode part 33, is removed. Thus, as shown in FIG. 29, it is possible to form the insulation layer 36 which has an opening 36a from which the electrode part 33 on the through electrode 22 is exposed, and covers the conductive wire part 34.

Figure 30:
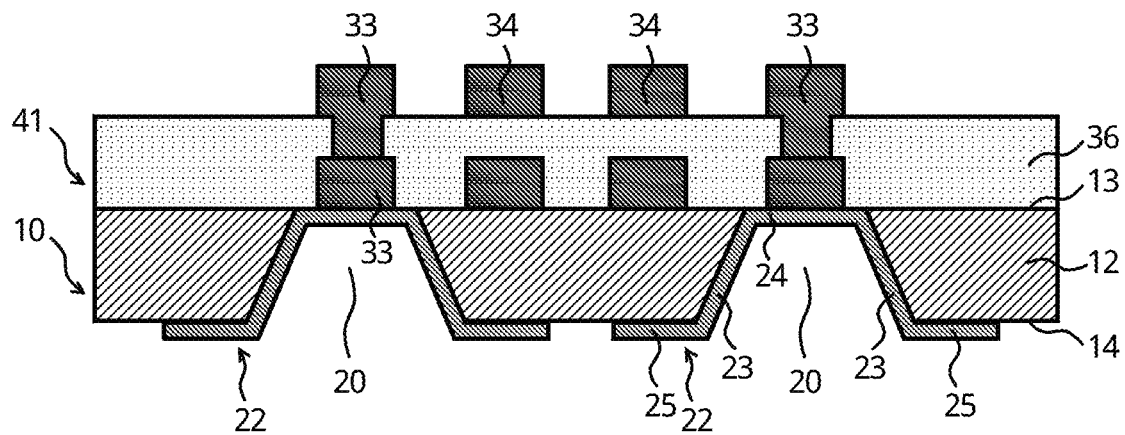
FIG. 30 is a view describing the manufacturing method of the through electrode substrate according to the third modification example.

Then, as shown in FIG. 30, the electrode part 33 is further formed on the electrode part 33, and the conductive wire part 34 is formed on the insulation layer 36. For example, similarly to the case when the electrode part 33 and the conductive wire part 34 are formed on the substrate 12, formation of the first layer functioning as a seed layer, formation of the resist layer, formation of the second layer by an electrolytic plating process, removal of the resist layer, and removal of the first layer are carried out in this order.

Figure 31:
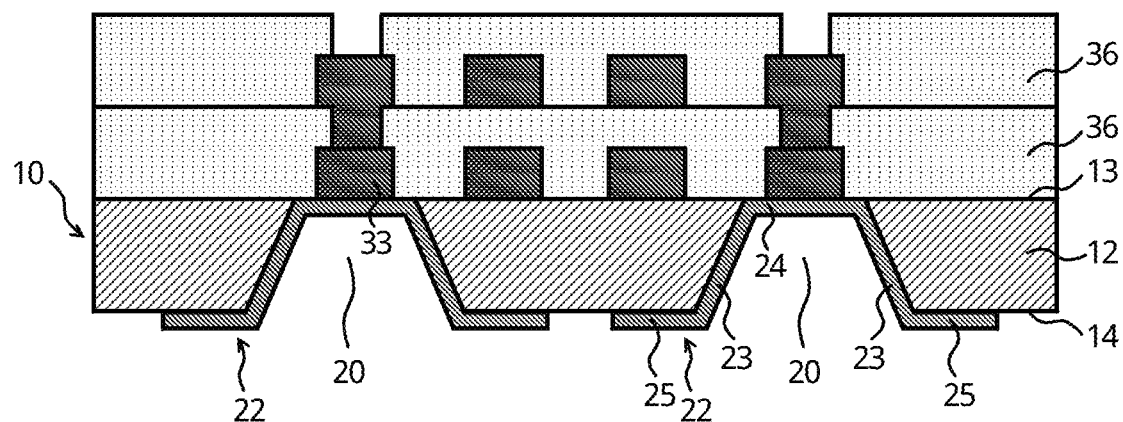
FIG. 31 is a view describing the manufacturing method of the through electrode substrate according to the third modification example.
Figure 32:
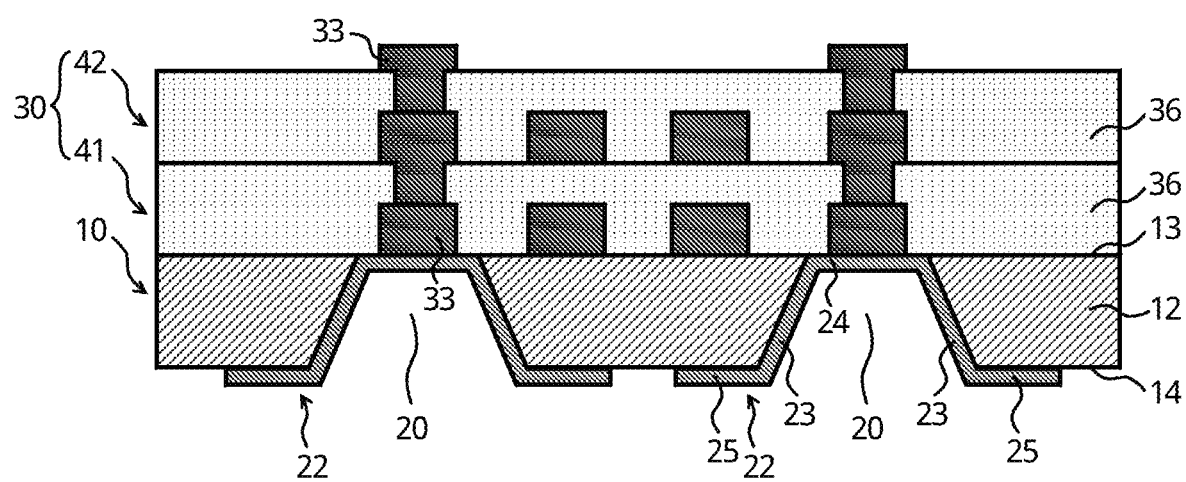
FIG. 32 is a view describing the manufacturing method of the through electrode substrate according to the third modification example.

Then, as shown in FIG. 31, the electrode part 33 on the through electrode 22 is exposed, and the insulation layer 36 covering the conductive wire part 34 is formed. Following thereto, as shown in FIG. 32, the electrode part 33 is further formed on the already provided electrode part 33, such that the electrode part 33 projects from the surface of the insulation layer 36. In this manner, it is possible to form the wiring layer 30 including the electrode parts 33 passing through the insulation layers 36, and the conductive wire parts 34 covered with the insulation layers 36.

Fourth Modification Example

Figure 33:
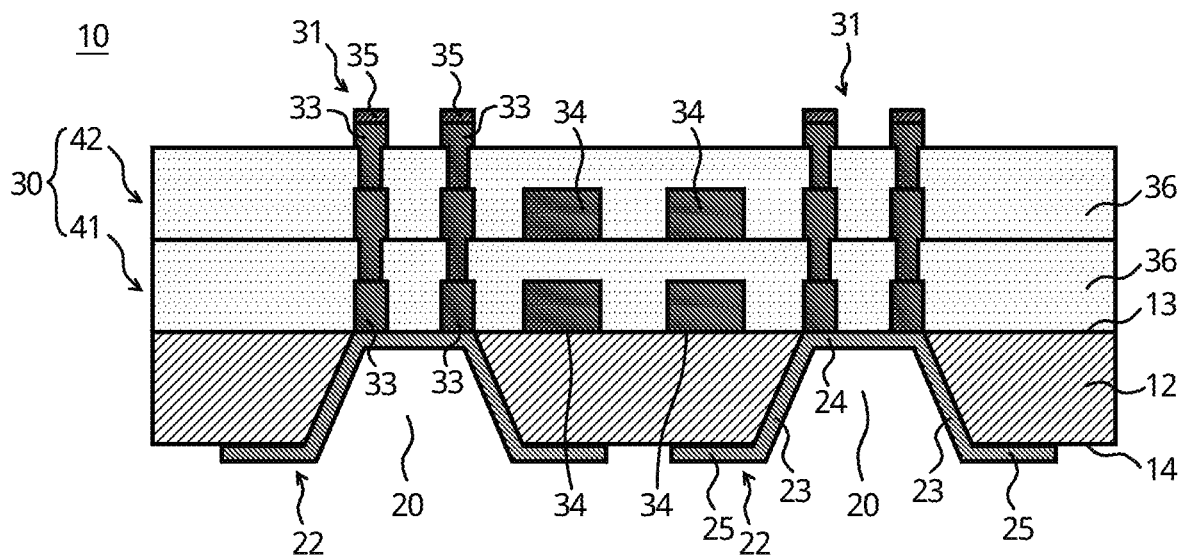
FIG. 33 is a sectional view showing the through electrode substrate according to a fourth modification example.

FIG. 33 is a sectional view showing the through electrode substrate 10 according to a fourth modification example. As shown in FIG. 33, a plurality of the electrode parts 33 passing through the insulation layer 36 of the wiring layer 30 may be connected to the second part 24 of the one through electrode 22. Since the electroconductive layer 31 of the wring layer 30 is formed after the second part 24 of the through electrode 22 of the through electrode substrate 10 has been formed, the electrode part 33 of the electroconductive layer 31 on the second part 24 can be divided into plural ones.

Fifth Modification Example

Figure 34:
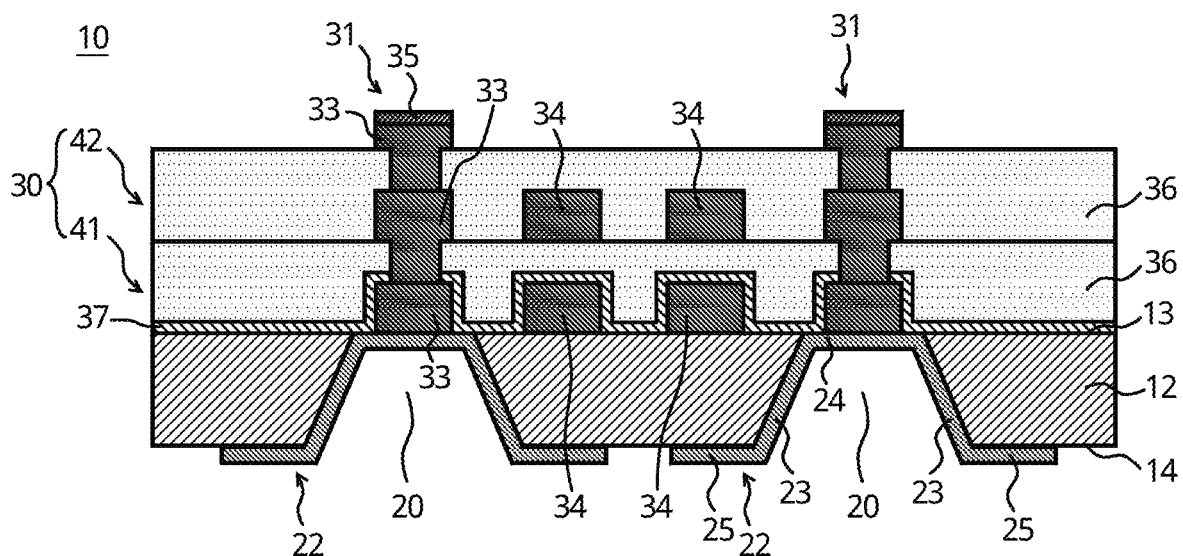
FIG. 34 is a sectional view showing the through electrode substrate according to a fifth modification example.

FIG. 34 is a sectional view of the through electrode substrate 10 according to a fifth modification example. As shown in FIG. 34, the wiring layer 30 provided on the side of the first surface 13 of the substrate 12 may further has a stress relaxation layer 37 located between the substrate 12 and the insulation layer 36. The stress relaxation layer 37 is a layer for relaxing an internal stress of the insulation layer 36. The stress relaxation layer 37 contains an inorganic material having an insulation property.

Herebelow, advantages of provision of the stress relaxation layer 37 are described. The insulation layer 36 of the wiring layer 30 contains an organic material. When such an insulation layer 36 is provided on the substrate 12 containing glass, an internal stress that pulls the substrate 12 is likely to be generated in the insulation layer 36. Herebelow, such an internal stress is referred to as tensile stress. When the tensile stress increases, there is a possibility that the substrate 12 is warped.

On the other hand, an internal stress that compresses the substrate 12 is likely to be generated in the stress relaxation layer 37 containing an inorganic material. Herebelow, such an internal stress is referred to as compressive stress. According to this modification example, since the stress relaxation layer 37 is provided between the substrate 12 and the insulation layer 36, the tensile stress of the insulation layer can be relaxed. Thus, it can be prevented that the substrate 12 is warped.

FIG. 34 shows an example in which the stress relaxation layer 37 is provided between the substrate 12 and the insulation layer 36 of the first wiring layer 41. However, the concrete position of the stress relaxation layer 37 is not particularly limited.

For example, the stress relaxation layer 37 may be positioned between the insulation layer 36 of the first wiring layer 41 and the insulation layer 36 of the second wiring layer 42. In this case, another stress relaxation layer 37 may also be present between the substrate 12 and the insulation layer 36 of the first wiring layer 41. Alternatively, the stress relaxation layer 37 may not be present between the substrate 12 and the insulation layer 36 of the first wiring layer 41.

The thickness of the insulation layer 36 and the thickness of the stress relaxation layer 37 are set such that their stresses can be suitably negated each other. For example, when the insulation layer 36 contains an organic material having an insulation property such as polyimide, epoxy, acryl, etc., and has a thickness of not less than 5 μm and not more than 20 μm, the stress relaxation layer 37 contains an insulation material such as a silicon compound and has a thickness of not less than 1 μm and not more than 5 μm. Examples of a silicon compound may be $SiO_2$, SiN, SiOC, SiC, SiOF, SiON, SiCN, etc.

Sixth Modification Example

Figure 35:
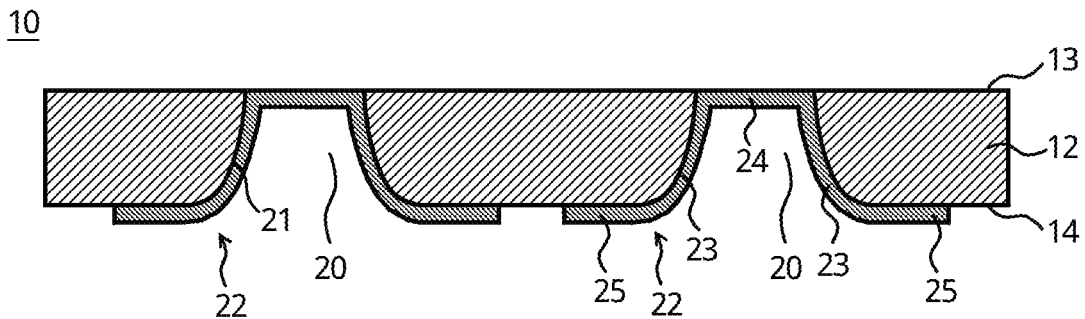
FIG. 35 is a sectional view showing the through electrode substrate according to a sixth modification example.

In the above embodiment, an example in which the sidewall 21 of the through hole 20 has a linear shape in the sectional view is shown. However, as long as the through electrode 22 including the first part 23 and the second part 24 can be provided, the shape of the through hole 20 is not particularly limited. For example, as shown in FIG. 35, the sidewall 21 of the through hole 20 may have a curved shape in a sectional view.

Seventh Modification Example

Figure 36:
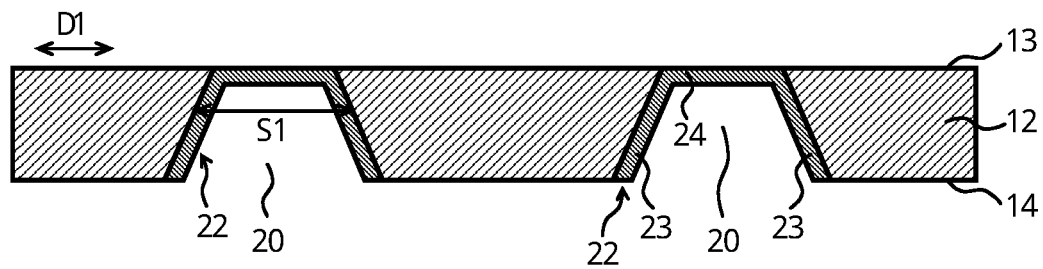
FIG. 36 is a sectional view showing the through electrode substrate according to a seventh modification example.
Figure 37:
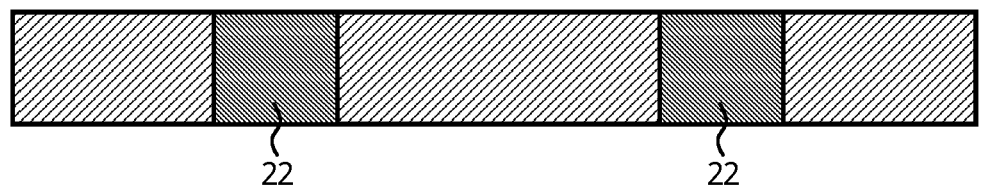
FIG. 37 is a view showing a conventional through electrode substrate having a filled via.
Figure 38:
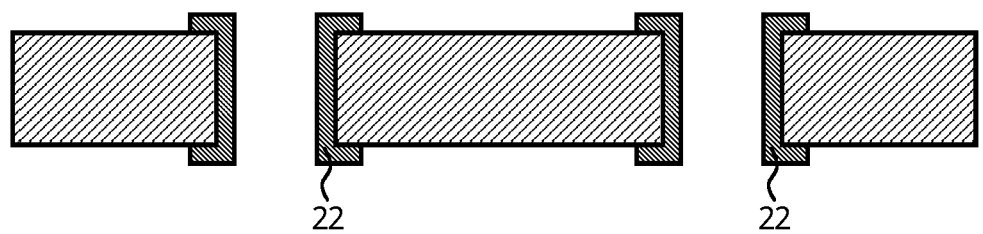
FIG. 38 is a view showing a conventional through electrode substrate having a conformal via.

In the above embodiment, an example in which the through electrode 22 has the third part 25 that is provided on the second surface 14, in addition to the first part 23 that spreads along the sidewall 21 of the through hole 20, the second part 24 that spreads in the surface direction D1 of the first surface 13 to come into contact with the sidewall 21 of the through hole 20 on the side of the first surface 13, is shown. However, as shown in FIG. 36, it is sufficient that the through electrode 22 has at least the first part 23 and the second part 24.

[Examples of Product on which Through Electrode Substrate is Loaded]

Figure 39:
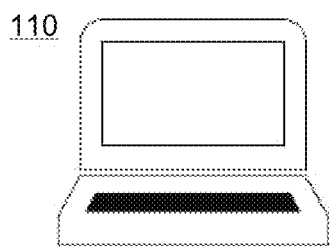
FIG. 39 is a view showing examples of products on which the through electrode substrate according to this embodiment of the disclosure is loaded.
Figure 39:
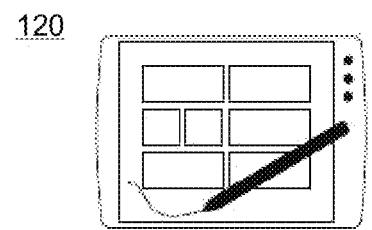
Figure 39:
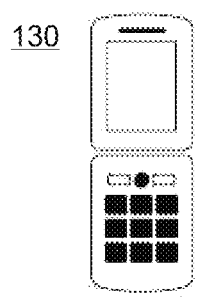
Figure 39:
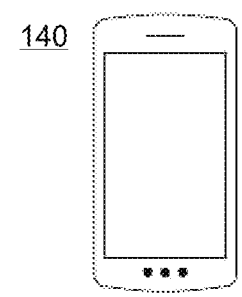
Figure 39:
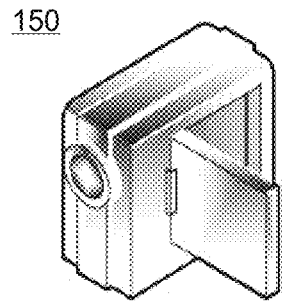
Figure 39:
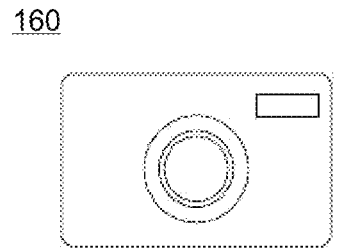
Figure 39:
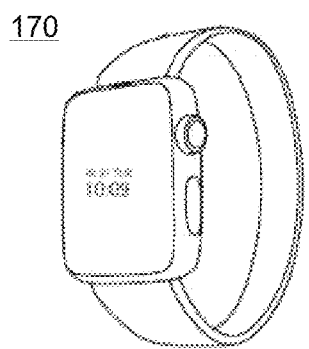
Figure 39:
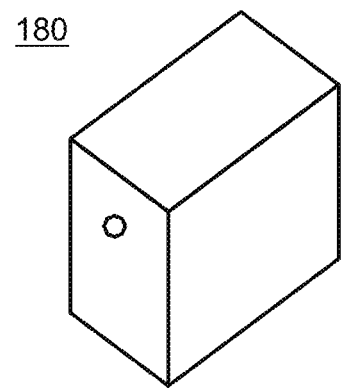

FIG. 39 is a view showing examples on which the through electrode substrate 10 according to this embodiment of the disclosure can be loaded. The through electrode substrate 10 according to this embodiment of the disclosure can be used in various products. For example, the through electrode substrate 10 can be loaded on a note-type personal computer 110, a tablet terminal 120, a mobile phone 130, a smart phone 140, a digital video camera 150, a digital camera 160, a digital watch 170, a server 180 and so on.

EXAMPLES

Next, the disclosure is described in more detail by way of examples. However, the disclosure should not be limited to the below description of the examples, a long as the disclosure departs from its scope.

Example 1

Figure 40:
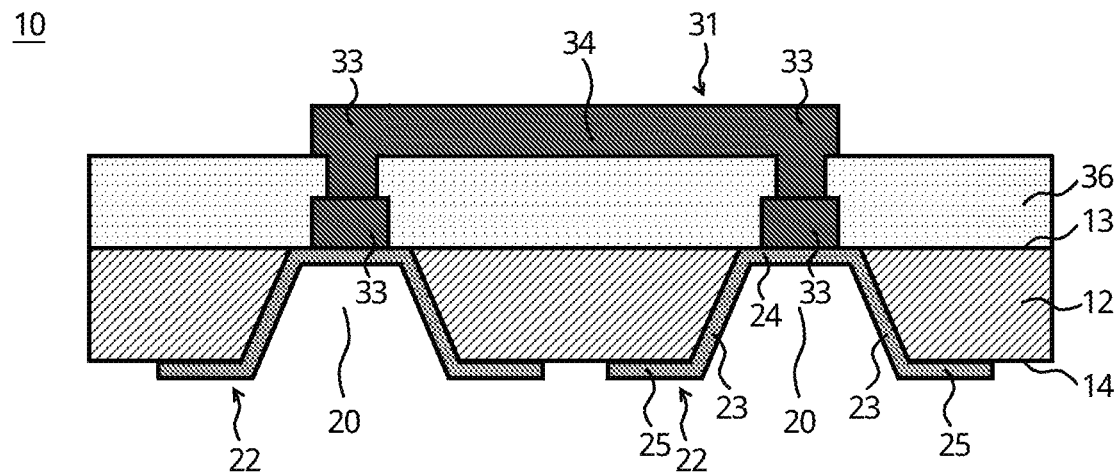
FIG. 40 is a sectional view showing a through electrode substrate in an Example 1.

Firstly, a through electrode substrate 10 shown in FIG. 40 was manufactured based on the manufacturing method of the through electrode substrate 10 according to the above embodiment of the disclosure. The through electrode substrate 10 included a substrate provided with a through hole 20, a through electrode 22 provided inside the through hole 20 and having a first part 23, a second pat 24 and a third part 25, and a wiring layer 30 provided on the side of a first surface 13 of the substrate 12 and having an electrode part 33 connected to the second part 24 of the through electrode 22. The wiring layer 30 included an insulation layer 36 provided on the side of the first surface 13 of the substrate 12 and having an opening corresponding to the electrode part 33, and a conductive wire part 34 provided on the insulation layer 36 and connecting the electrode parts 33 on the second parts 24 of the through hole electrodes 22 of the adjacent two through holes 20 through the openings of the insulation layer 36.

A temperature cycle test was carried out 1000 times, with applying current between the through electrodes 22 of the adjacent two through holes 20. Each cycle included a step in which an ambient temperature of the through electrode substrate 10 was increased from −45° C. to 125° C., a step in which the ambient temperature was maintained at 125° C., a step in which the ambient temperature is decreased from 125° C. to −45° C., and a step in which the ambient temperature was maintained at −45° C.

A time required for one cycle was 40 minutes.

After the temperature cycle test was carried out 1000 times, whether failure in current application occurred or not was inspected. It was confirmed that, in all the inspection points, no failure in current application occurred.

Comparative Example 1

Figure 41:
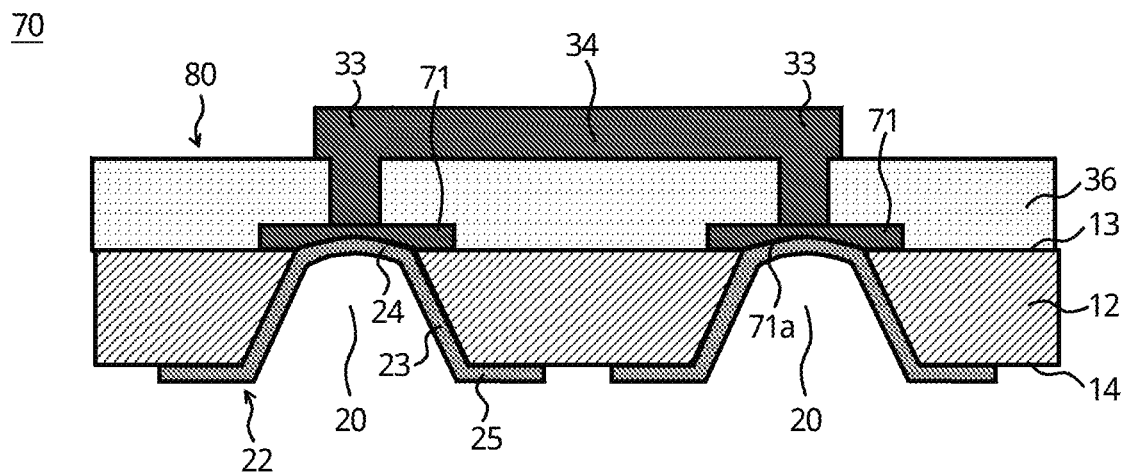
FIG. 41 is a sectional view showing a through electrode substrate in a Comparative Example 1.

Firstly, a through electrode substrate 70 shown in FIG. 41 was manufactured based on the manufacturing method of the through electrode substrate 70 according to the above comparative embodiment. The through electrode substrate 70 included a substrate 12 provided with a through hole 20, a through electrode 22 provided inside the through hole 20 and having a first part 23, a second pat 24 and a third part 25, and a wiring layer 80 provided on the side of a first surface 13 of the substrate 12 and having an electroconductive layer 71 connected to the second part 24 of the through electrode 22. The wing layer 80 included an insulation layer 36 provided on the side of the first surface 13 of the substrate 12 and having an opening corresponding to the electroconductive layer 71, and a conductive wire part 34 provided on the insulation layer 36 and connecting the electroconductive layers 71 on the second parts 24 of the through hole electrodes 22 of the adjacent two through holes 20 through the openings of the insulation layer 36.

Similarly to the case of the above Example 1, the temperature cycle test was carried out 1000 times.

In 80% of the inspection points, failure in current application occurred. In the Comparative Example 1, the failure in current application was considered to occur because the recess 71a was generated in the electroconductive layer 71 so that electric connection between the electroconductive layer 71 and the second part 24 of the through electrode 22 became unstable by corrosion of the recess 71a.

DESCRIPTION OF REFERENCE NUMERALS

10 Through electrode substrate
12 Substrate
13 First surface
14 Second surface
16 First resist layer
16a Opening
17 Sealing layer
18 Second resist layer
20 Through hole
21 Sidewall
22 Through electrode
22a First layer
22b Second layer
23 First part
24 Second part
25 Third part
30 Wiring layer
31 Electroconductive layer
33 Electrode part
34 Conductive wire part
35 Coating layer
36 Insulation layer
36a Opening
37 Stress relaxation layer
38 Electrode part
41 fist wiring layer
42 Second wiring layer
50 Mounting substrate
51 Element
52 Terminal
55 Circuit board
56 Base member
57 Electrode part
70 Through electrode substrate
71 Electroconductive layer

What is claimed is:

1. A manufacturing method of a through electrode substrate comprising:
   a step of preparing a substrate including a first surface and a second surface positioned oppositely to the first surface, and provided with a through hole;
   a step of providing a sealing layer blocking the through hole on the first surface of the substrate;
   an electrode forming step of forming a through electrode inside the through hole, the through electrode having a first part extending along a sidewall of the through hole, and a second part connected to the first part and spreading along the sealing layer; and
   a step of removing the sealing layer,
   wherein the through electrode substrate comprises a wiring layer provided on the first surface of the substrate, and
   the wiring layer comprises an electroconductive layer positioned on the first surface of the substrate and connected to the second part of the through electrode.

2. The manufacturing method of a through electrode substrate according to claim 1, wherein
   in a surface direction of the first surface of the substrate, a size of a part of the electroconductive layer of the wiring layer, which is connected to the second part of the through electrode, is smaller than a size of the second part of the through electrode.

3. The manufacturing method of a through electrode substrate according to claim 1, wherein
   the electroconductive layer includes an electrode part having a profile overlapped with the second part of the through electrode and surrounded by the second part, when seen along a normal direction of the first surface of the substrate.

4. The manufacturing method of a through electrode substrate according to claim 3, wherein
   the electroconductive layer includes a plurality of the electrode parts.

5. The manufacturing method of a through electrode substrate according to claim 1, wherein
   the electroconductive layer includes a conducive wire part intersecting a profile of the second part of the through electrode, when seen along a normal direction of the first surface of the substrate.

6. The manufacturing method of a through electrode substrate according to claim 5, wherein
   the electroconductive layer includes a plurality of the conducive wire parts.

7. The manufacturing method of a through electrode substrate according to claim 1, wherein
   the substrate contains glass.

8. A through electrode substrate comprising:
a substrate including:
a first surface;
a second surface positioned oppositely to the first surface; and
a through hole;
a through electrode inside the through hole of the substrate, the through electrode having:
a first part spreading along a sidewall of the through hole; and
a second part connected to the first part and spreading in a surface direction of the first surface to come into contact with the sidewall of the through hole on a side of the first surface of the substrate; and
a wiring layer on the first surface of the substrate, the wiring layer having an electroconductive layer on the first surface of the substrate and connected to the second part of the through electrode.

9. The through electrode substrate according to claim 8, wherein
the second part of the through electrode is positioned coplanarly with the first surface of the substrate.

10. The through electrode substrate according to claim 8, wherein
a size of the through hole in the surface direction of the first surface of the substrate increases from the first surface toward the second surface.

11. The through electrode substrate according to claim 8, wherein
the substrate contains glass.

12. The through electrode substrate according to claim 8, wherein
a plurality of the through holes and a plurality of the through electrodes are formed in the substrate; and
when the substrate is virtually divided equally into sixteen sections in the surface direction of the first surface, each of the number of the through holes formed in the sixteen sections is within a range of an average value ±20%.

13. The through electrode substrate according to claim 8, wherein
in the surface direction of the first surface of the substrate, a size of a part of the electroconductive layer of the wiring layer, which is connected to the second part of the through electrode, is smaller than a size of the second part of the through electrode.

14. The through electrode substrate according to claim 8, wherein
the electroconductive layer includes an electrode part having a profile overlapped with the second part of the through electrode and surrounded by the second part, when seen along a normal direction of the first surface of the substrate.

15. The through electrode substrate according to claim 14, wherein
the electroconductive layer includes a plurality of the electrode parts.

16. The through electrode substrate according to claim 8, wherein
the electroconductive layer includes a conducive wire part intersecting a profile of the second part of the through electrode, when seen along a normal direction of the first surface of the substrate.

17. The through electrode substrate according to claim 16, wherein
the electroconductive layer includes a plurality of the conducive wire parts.

18. The through electrode substrate according to claim 8, wherein
the wiring layer further has an insulation layer containing an organic material, and a stress relaxation layer containing an inorganic material.

19. The through electrode substrate according to claim 18, wherein:
the wiring layer has a first wiring layer including the electroconductive layer positioned on the first surface of the substrate and the insulation layer, and a second wiring layer including the electroconductive layer positioned on the first wiring layer and the insulation layer; and
the stress relaxation layer is positioned at least between the first surface of the substrate and the insulation layer of the first wiring layer, or between the insulation layer of the first wiring layer and the insulation layer of the second wiring layer.

20. The through electrode substrate according to claim 14, further comprising
an element having a terminal connected to the electrode part.

21. The through electrode substrate according to claim 8, wherein
the second part has a thickness larger than a thickness of the first part.

22. The through electrode substrate according to claim 8, wherein
a hollow part exists inside the through hole between surfaces of the opposed first parts.

23. The through electrode substrate according to claim 22, wherein
a material having an insulation property is provided in the hollow part.

* * * * *